(12) United States Patent
Baldwin, Jr. et al.

(10) Patent No.: US 12,114,462 B2
(45) Date of Patent: Oct. 8, 2024

(54) MODULAR CARD CAGE ACCESSORIES

(71) Applicant: NATIONAL INSTRUMENTS CORPORATION, Austin, TX (US)

(72) Inventors: Richard G. Baldwin, Jr., Austin, TX (US); Michael H. Singerman, Lincoln, TX (US)

(73) Assignee: National Instruments Corporation, Austin, TX (US)

( * ) Notice: Subject to any disclaimer, the term of this patent is extended or adjusted under 35 U.S.C. 154(b) by 66 days.

(21) Appl. No.: 17/820,112

(22) Filed: Aug. 16, 2022

(65) Prior Publication Data

US 2022/0394879 A1 Dec. 8, 2022

Related U.S. Application Data

(62) Division of application No. 16/901,829, filed on Jun. 15, 2020, now Pat. No. 11,452,231.

(60) Provisional application No. 62/862,238, filed on Jun. 17, 2019.

(51) Int. Cl.
  *H05K 1/14* (2006.01)
  *H05K 5/02* (2006.01)
  *H05K 7/20* (2006.01)

(52) U.S. Cl.
  CPC ......... *H05K 7/20145* (2013.01); *H05K 1/141* (2013.01); *H05K 5/026* (2013.01)

(58) Field of Classification Search
  CPC ............. H05K 7/20563; H05K 7/1418; H05K 7/1461; H05K 7/20136; G06F 1/186; G06F 1/185; G06F 1/20; F28F 13/06
  USPC ....... 361/690, 756, 695, 752, 796, 694, 724, 361/720, 679.51, 689, 741, 679.5, 829; 454/184; 165/80.3; 312/223.2, 236
  See application file for complete search history.

(56) References Cited

U.S. PATENT DOCUMENTS

| | | | | |
|---|---|---|---|---|
| 6,151,213 A | * | 11/2000 | Ater | H05K 7/1418 361/752 |
| 6,816,590 B2 | * | 11/2004 | Pike | H04Q 1/112 361/752 |
| 9,295,169 B1 | * | 3/2016 | Spinner | G01R 31/31907 |
| 2006/0171119 A1 | * | 8/2006 | Baldwin | H05K 7/20672 361/700 |

(Continued)

*Primary Examiner* — Mandeep S Buttar
(74) *Attorney, Agent, or Firm* — Kowert, Hood, Munyon, Rankin & Goetzel, P.C.; Jeffrey C. Hood

(57) ABSTRACT

Various types of electronic devices may be mounted in a chassis in order to facilitate interfacing with the devices, containing the devices, provide cooling systems which may remove heat from the electronic devices, etc. Delivering adequate cooling air flow to each electronic device in a chassis may be an important issue for the proper functioning, lifetime, or other characteristics of electronic devices contained in a chassis. Some electronic devices may be particularly challenging to cool due to various design characteristics. Other electronic devices may have other requirements that are not well served by existing chassis designs. For example, some electronic devices may benefit from additional electrical and/or thermal connections. Embodiments presented herein describe a novel design for a modular card cage accessory that may be configured to modify air flow and/or to meet particular requirements of an electronic device in a chassis, among various possibilities.

20 Claims, 18 Drawing Sheets

(56) References Cited

U.S. PATENT DOCUMENTS

2011/0267776 A1* 11/2011 Porreca ............... H05K 7/1404
                                                    361/720
2016/0157375 A1*  6/2016 Sato .................... H05K 9/0062
                                                    361/756
2016/0249479 A1*  8/2016 Kanasaki .......... H05K 7/20736

* cited by examiner

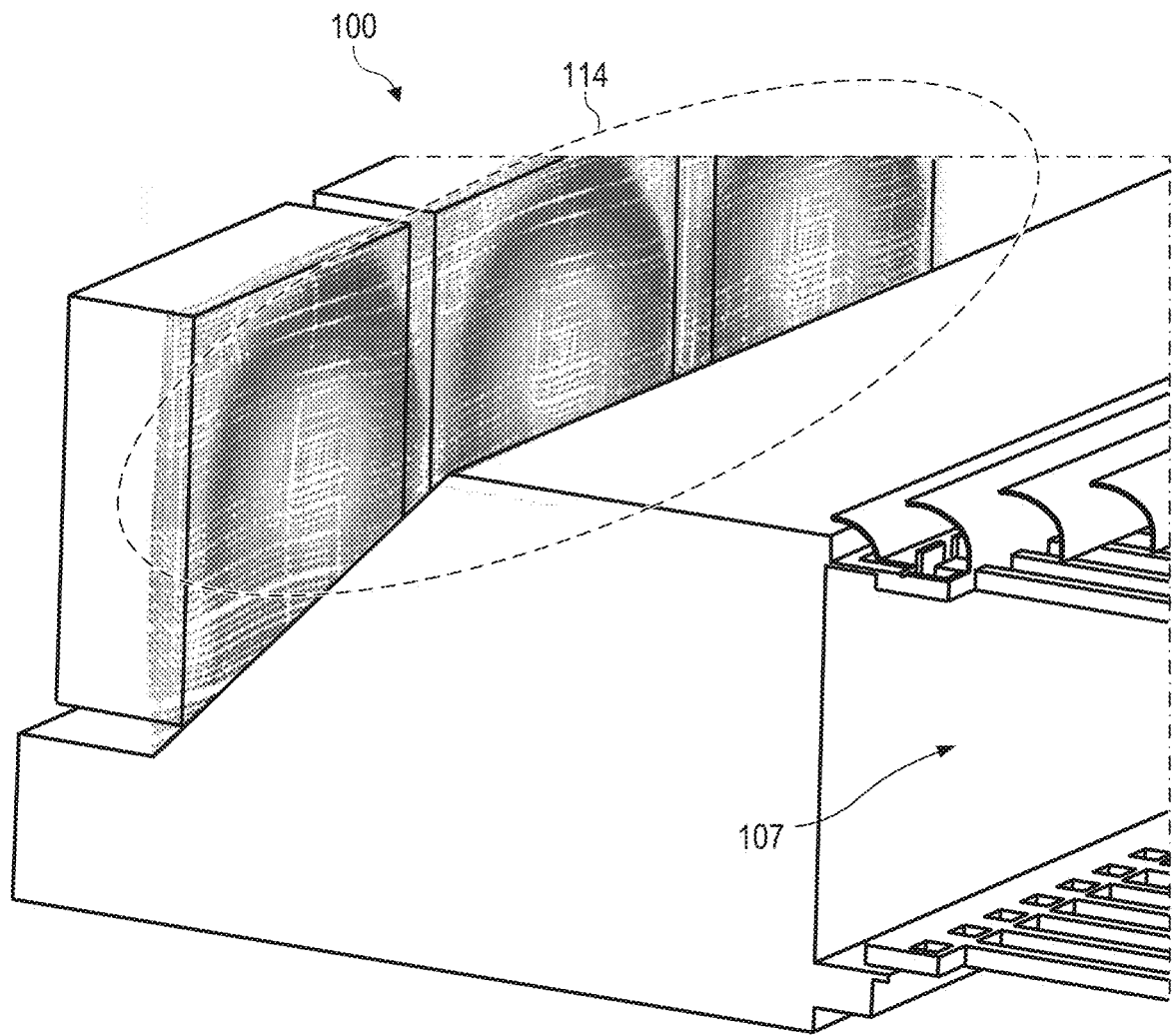
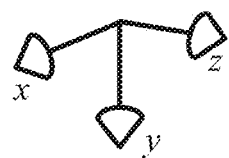
FIG. 4

MODULAR CARD CAGE ACCESSORIES

PRIORITY CLAIM

This application is a divisional application of U.S. application Ser. No. 16/901,829, entitled "Modular Card Cage Accessories", filed Jun. 15, 2020, which claims the benefit of priority to U.S. provisional patent application Ser. No. 62/862,238, entitled "Modular Diverter with or without an integrated card guide," filed Jun. 17, 2019, which are hereby incorporated by reference in their entirety as though fully and completely set forth herein.

BACKGROUND

Technical Field

The present invention relates generally to mechanisms for modifying thermal or other conditions for one or more electronic circuit boards within a chassis.

Description of the Related Art

Various types of electronic devices may be mounted in a chassis in order to facilitate interfacing with the devices, containing the devices, managing the devices, or other reasons. Some electronic devices generate excess heat in the course of their operation. In some embodiments, a chassis includes a cooling system which may remove heat from the electronic devices. An example of a cooling system is a fan or set of fans which may be configured to move air through or across the electronic devices. Delivering adequate and appropriate air flow to each electronic device in a chassis may be an important issue for the proper functioning, lifetime, or other characteristics of electronic devices contained in a chassis. As such, improvements in the field of controlling air flow and more generally improving conditions for electronic devices are desirable.

SUMMARY

Instruments for collecting data or information from an environment, unit under test, or various other measurement objects may be coupled to and controlled by computer systems. Data collected by these instruments may be used to control units being tested (e.g., an overheated unit may be shutdown) or an environment (e.g., ventilation systems may be activated if a certain chemical is detected in the air), among various possibilities. Instrumentation systems such as those described above may run on a platform such as Peripheral Component Interconnect (PCI) eXtensions for Instrumentation (PXI). PXI may combine a high-speed PCI bus with integrated timing and triggering features designed for measurement and automation applications to deliver performance improvements over other architectures. PCI or PXI devices may be comprised of modules (e.g., electronic devices) which may be grouped together as modules in a chassis in some embodiments. However, due to the compact design of these modules (and related module features including heat sink locations, thermally sensitive portions of the module, portions of the module (or adjacent modules) that redistribute or block air flow, module impedance, etc.), meeting cooling needs of some modules may be challenging. In particular, some parts of a module may not receive sufficient cooling air flow provided by a general chassis cooling system. Modular card cage accessories may adapt air flow to meet the particular cooling requirements of one or more modules and thus improve performance, extend the life time, and/or provide other benefits to the module and the larger measurement system.

Embodiments presented herein describe a novel design for a modular card cage accessory, such as a modular diverter. A modular card cage accessory may be designed to promote favorable conditions for one or more modules in a chassis. For example, a modular card cage accessory may direct air flow in a manner customized for the particular requirements of a module. The modular card cage accessory may or may not include integrated card guide features, e.g., to support a module. The modular card cage accessory may be designed for installation in the same slot (or slots) as the module for which it is designed to provide customized air flow, or the modular card cage accessory may be designed for installation in one or more other (e.g., adjacent) slots. In some embodiments, the modular card cage accessory may accept air in from outside of the chassis and/or direct air out of the chassis, e.g., to cool an external module or peripheral.

In some embodiments, in addition to, or instead of, adjusting air flow, a modular card cage accessory may provide functions such as heating, active cooling, shielding, sensing, electrical communication, vibration dampening, etc. to one or more modules in the chassis.

BRIEF DESCRIPTION OF THE DRAWINGS

FIG. 4 is a diagram illustrating a swirl element from fans in a chassis, according to some embodiments;

FIGS. 19 and 20 illustrate an exemplary card guide side, according to some embodiments.

FIG. 21 illustrates the exemplary card guide side attached to rails, according to some embodiments.

Figure 1A:
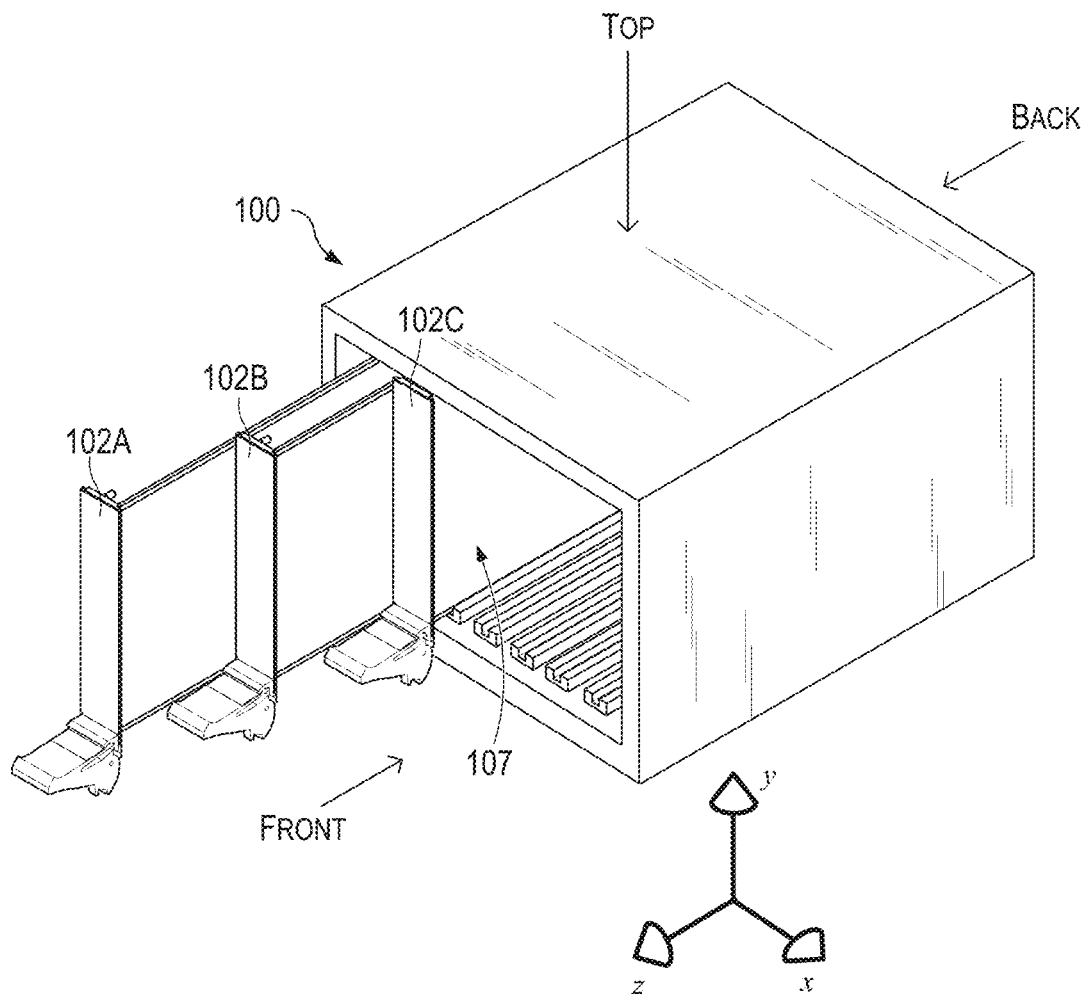
FIG. 1A illustrates a chassis 100 and plug-in modules 102A-C.

While the invention is susceptible to various modifications and alternative forms, specific embodiments thereof are shown by way of example in the drawings and are herein described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure, including the appended claims. Particular features, structures, or characteristics may be combined in any suitable manner consistent with this disclosure.

It is to be understood that the terminology used herein is for the purpose of describing particular embodiments only, and is not intended to be limiting. As used herein, the singular forms "a", "an", and "the" include singular and plural referents unless the content clearly dictates otherwise. Furthermore, the words "can" and "may" are used throughout this application in a permissive sense (i.e., having the potential to, being able to), not in a mandatory sense (i.e., must). The term "include," and derivations thereof, mean "including, but not limited to." The term "coupled" means directly or indirectly connected.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "mobile device configured to generate a hash value" is intended to cover, for example, a mobile device that performs this function during operation, even if the device in question is not currently being used (e.g., when its battery is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed mobile computing device, for example, would not be considered to be "configured to" perform some specific function, although it may be "configurable to" perform that function. After appropriate programming, the mobile computing device may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Various instruments and/or computer systems may be configured within a chassis. Examples of various types of instruments include oscilloscopes, digital multimeters, pressure sensors, etc., and the types of information that might be collected by respective instruments include voltage, resistance, distance, velocity, pressure, oscillation frequency, humidity or temperature, among others. An example of a chassis includes a housing that includes a plurality of slots for instruments, associated computer systems, and/or other electronic devices, and a system for providing cooling. An example cooling system may be a set of fans providing air flow through the chassis. Modules may be inserted or plugged into the plurality of slots in the chassis. The modules may be referred to herein as 'modules', 'plug-in models', 'cards', or 'electronic devices'. The modules may use any of various form factors and/or conform to any of various standards. Such standards and/or form factors may include Advanced Telecommunications Computing Architecture (ATCA), AdvancedTCA Extensions for Instrumentation and Test (AXIe), Virtual Machine Environment (VME), VME eXtensions for Instrumentation (VXI), VPX (which is based on VME and is also known as VITA 46), Peripheral Component Interconnect (PCI), Compact Peripheral Component Interconnect (CompactPCI), CompactPCI-Express, PCI Extended (PCI-X), parallel PCI, PCI eXtensions for Instrumentation (PXI), and/or PXI-Express (PXIe), in various embodiments. The modules may include controllers and/or peripherals. In some embodiments, particular modules may have particular cooling requirements. Accordingly, it may be beneficial to provide customized air flow to some modules, e.g., in order to increase or redirect air flow to cool particular components on a module. For example, a controller may have specific cooling requirements.

The modular design of a system of modules and a chassis may have many advantages (e.g., flexibility, compactness, etc.). However, due to the compact design of these modules, and related module features including heat sink locations, portions of the module (or adjacent modules) that redistribute or block air flow, module impedance, etc., meeting cooling needs of some modules may be challenging. In particular, some parts of a module (e.g., thermally sensitive portions) may not receive sufficient cooling air flow provided by a general chassis cooling system. Modular card cage accessories may adapt air flow to meet the particular cooling requirements of one or more modules and thus improve performance, extend the life time, and/or provide other benefits to the module and the larger measurement system.

Figure 1B:
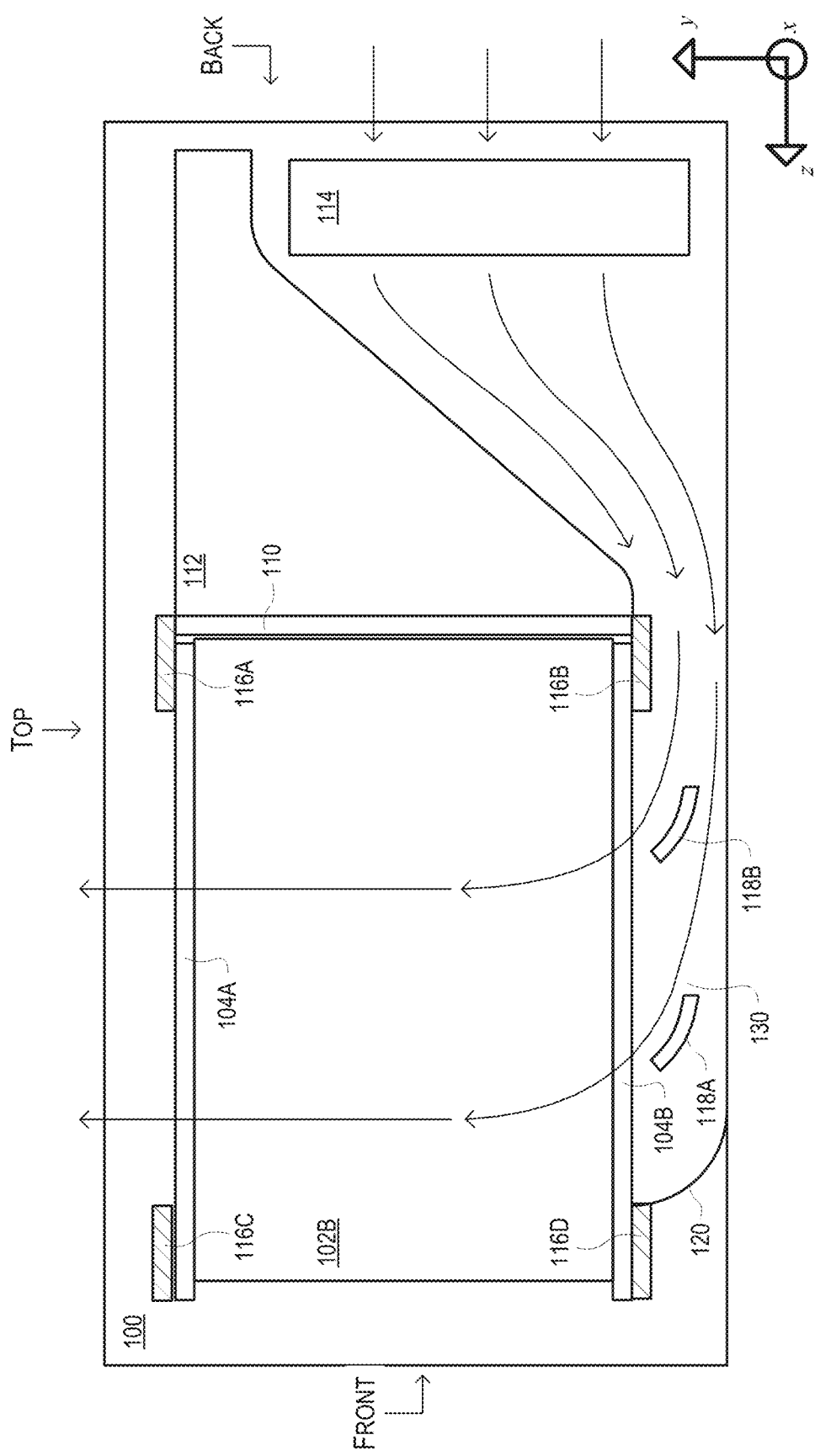
FIG. 1B illustrates internal air flow in a cross-sectional view of a chassis 100.

FIGS. 1A and 1B—Example Chassis

FIG. 1A illustrates an exemplary chassis 100, e.g., a chassis conforming to any one of various standards or form factors, e.g., ATCA, VXI, VME, CompactPCI, CompactPCI-Express, PXI, or PXIe, among various possibilities. The chassis 100 may include a card cage (e.g., housing) 107 that includes and/or is configured to define a plurality of slots. Each of exemplary plug-in modules 102A-C may be inserted into respective slots of the plurality of slots of card cage 107 (e.g., sub-rack) of chassis 100. Card cage 107 may extend from the front of the chassis back to the backplane 110 (illustrated in FIG. 1B), from the top to the bottom, and include all of the slots (e.g., from the slot associated with module 102A through the empty slots to the right). The plug-in modules, which may be referred to herein as 'modules', 'components', or 'electronic devices', may be PXI, PXIe, CompactPCI, or CompactPCI-Express cards, etc., in various embodiments.

The modules 102A-C may be controllers and/or peripherals.

A peripheral may be a module that is associated with a specific measurement instrument, other device, or a set of instruments and/or devices. A peripheral may typically take up a single slot, however it will be appreciated that some peripherals may occupy more than one slot.

A controller may be a module that controls the overall system, e.g., a controller may manage one or more peripherals. A controller may occupy a specific slot, e.g., the chassis may include a designated controller slot, according to some embodiments. The controller slot may be wider than other slots (e.g., a peripheral slot). For example, the controller slot may be 5 slots wide, among various possibilities. Controllers may have higher energy and/or cooling requirements than peripherals. For example, controllers (e.g., Extreme-Class controllers and/or embedded or non-embedded controllers of other types) may have high cooling requirements and/or structural features that may make meeting cooling requirements for some elements of the controller challenging. Accordingly, controllers may be an example use case for a modular card cage accessory to provide custom air flow.

As shown, the modules 102 may be oriented in the y-z plane. The chassis may include any number of slots arranged in the x direction.

FIG. 1B illustrates an internal structure of the exemplary chassis 100 showing plug-in module 102B inserted into the chassis 100. The plug-in module 102B may be guided during insertion into the chassis 100 (e.g., from the front) by card guide 104A-B until connectors of the plug-in module 102B make connection with the backplane 110. Once connected to the backplane, the plug-in module 102B may be supported by the connectors of the plug-in module 102B, backplane 110, and/or the card guide 104A-B. In some embodiments, the plug-in module 102 may be supported by the front panel of chassis 100. The plug-in module 102B may connect to the card guides 104A-B and/or rails 116 in any of various ways. For example, the card guide 104A-B may include grooves (e.g., one groove on each side) and the module 102B may slide into these grooves and be held in place by friction. In other words, the plug-in module 102B may not positively connect to the card guides 104A-B and/or rails 116, and may rest on the card guide and/or rails. As another example, the plug-in module 102B may positively connect to the card guides 104A-B and/or rails 116, e.g., by snapping, clipping, clamping, or being screwed, etc. As another possibility, the module may rest on the card guide and attach to one or more rails, or vice versa. Note that card guide 104A-B may be referred to as a first, e.g., upper, card guide side 104A and a second, e.g., lower, card guide side 104B. In some embodiments, the card guide 104A-B may be conduction cooled.

In some embodiments, the connectors between the plug-in module 102B and the backplane 110 may comprise a pair of connectors, one mounted on the plug-in module 102B and a mating connector mounted on the backplane 110.

Additional circuitry 112 may be mounted behind the backplane 110 and may interact with the plug-in module 102B through the connectors. For example, circuitry 112 may provide electrical power to the plug-in module 102B and may provide connections between the various modules 102 (e.g., 102B may be connected to 102A and/or 102C, etc., e.g., peripheral modules may be connected to each other and/or to a controller module via circuitry 112 and/or backplane 110). For example, circuitry 112 may provide for synchronization of activities between multiple plug-in modules 112.

Backplane 110 and card guides 104A-B may be coupled or attached to card cage support members (e.g., rails or sub-rack support members) 116A-B. Additional card cage support members 116C-D may be included at or near the front of the chassis 100 to provide further support to card guides 104A-B. Pusher fan 114 may force air into the card cage 107 of chassis 100 and under the support member 116B (arrows indicate typical air flow). Air flowing through plenum 130 and under the support member 116B may be redirected by turning vanes 118A and 118B and deflector 120 toward heat producing components of plug-in module 102B and other modules in the card cage 107.

It will be appreciated that chassis 100 as shown in FIGS. 1A and 1B is an illustrative example. Some chassis may have different orientations, layouts, and features. For example, some chassis may have modules oriented in the x-z direction with slots in the y direction, among various possibilities. As another example, a fan may be placed directly beneath the card cage and blowing air straight up (e.g., through the card cage) rather than through a plenum. Similarly, fans may be placed on top, sides, front, back and or bottom to push and/or pull air through the card cage. In the illustrated example, air flow is in the +y direction, however in other embodiments the primary direction of air flow may be in other directions (e.g., −y, +/−x, +/−z, etc.).

Some chassis may include additional features and/or may not include some illustrated features. For example, some chassis may not include turning vanes 118, etc. Similarly, some chassis may not include a plenum 130.

Figure 2:
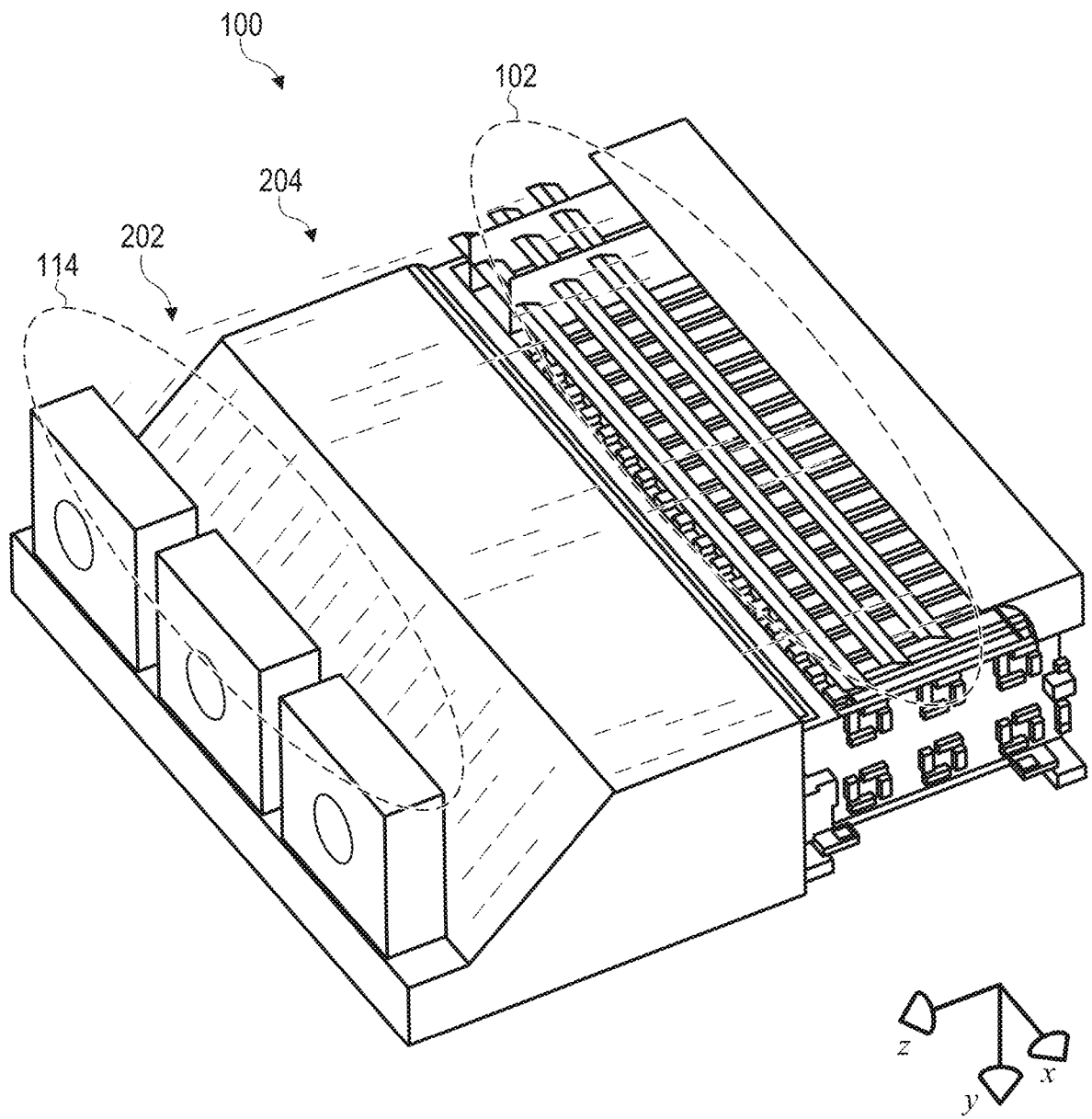
FIG. 2 illustrates the components and air flow of a chassis 100, according to some embodiments.
Figure 3:
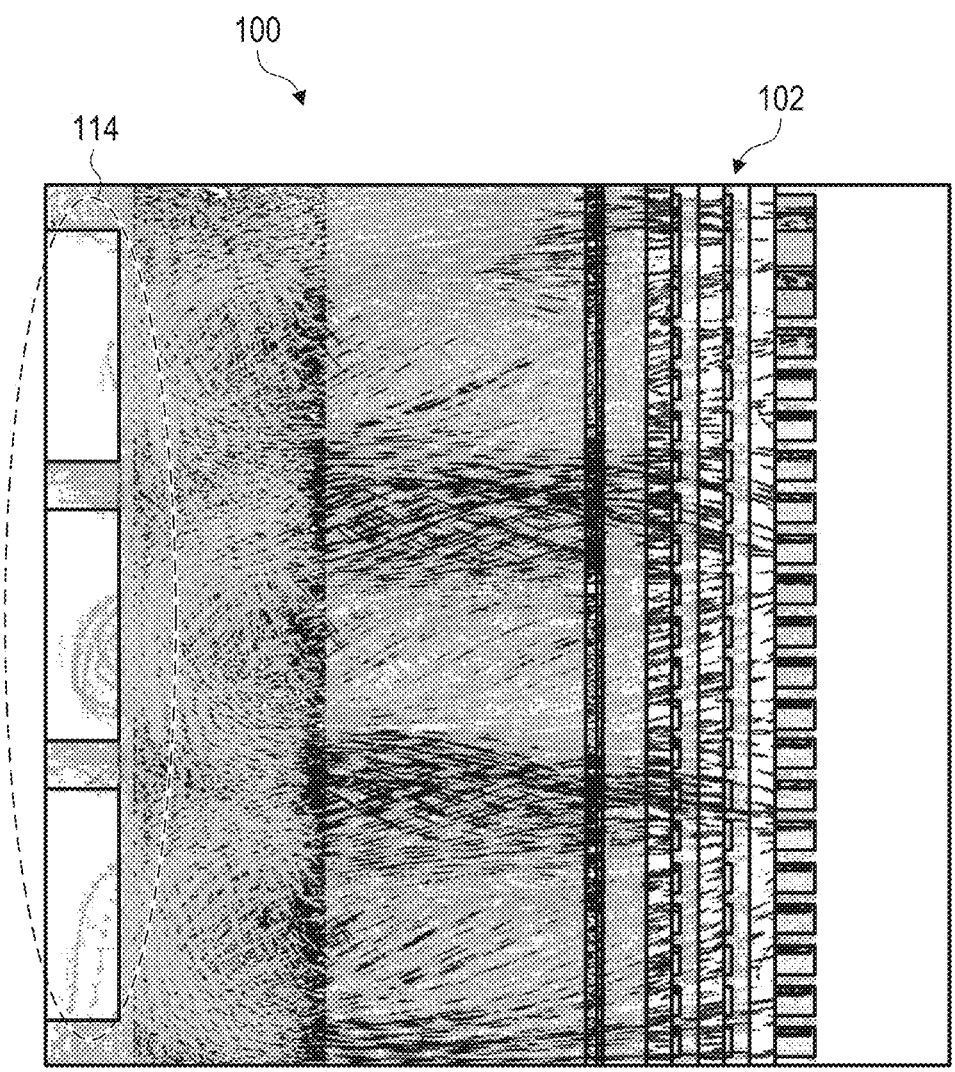
FIG. 3 is a diagram illustrating the components and air flow of a chassis 100 from a bottom up view, according to some embodiments.

FIGS. 2-4—Air Flow in a Chassis

FIG. 2 illustrates an isometric bottom up view of an embodiment of a chassis 100, which includes a set of fans 114 and a set of modules 102 which require cooling. In the illustrated embodiment, simulated air flow is shown using gray dashed lines, which represent the path of a single simulated air particle. Air flow may be created by fans 114, pass through the card cage of the chassis and over the modules 102, and then exit the chassis 100, carrying away excess heat. In the illustrated embodiment, multiple modules may be included in the chassis such that modules are placed adjacent to each other in the x direction, and the air flow from the fans passes through the chassis substantially along the z direction, and then exits the chassis predominantly along the y-direction.

FIG. 2 shows a chassis that has three axial fans 114 arranged along a horizontal direction, hereinafter referred to as the x-direction. In other words, the direction that leads from the center of one fan to the center of an adjacent fan is herein referred to as the x-direction. In the present disclosure, the phrase 'arranged along' may refer to the direction leading from an object to a subsequent object.

FIG. 2 further illustrates that the three axial fans are predominantly oriented in a first plane, wherein the first plane consists of the x-direction and a second, vertical direction (e.g. when the chassis is oriented horizontally) that is perpendicular to the first direction. This second direction will be referenced in the present disclosure as the y-direction. Herein 'predominantly oriented in' and 'predominantly oriented along' refer to the orientation of an object in space according to its largest dimension or dimensions. We further note that in the case of a single object, the phrases 'arranged along' and 'predominantly oriented along' will be taken synonymously, such that both phrases refer to the orientation of an object in space according to its largest dimension or dimensions.

FIG. 2 further illustrates that the three axial fans are configured to blow air predominantly in a third direction that is perpendicular to the first plane (i.e., the third direction is perpendicular to each of the x and y directions). This third direction will be herein referred to as the z-direction. Hence, the x, y, and z directions form a mutually perpendicular set of cartesian coordinate axes. As illustrated, the blown air is directed through a ramped or 'sloped' channel 202. The ramped channel 202 may be referred to as a 'first region' 202 of the channel. Hence, in the illustrated embodiment, after leaving the fans the blown air acquires a velocity component in the y-direction (e.g., so that the air velocity is predominantly in the y-z plane) until it reaches the flat 'plateau' section of the channel 204, wherein the predominant direction of air flow is again along the z-direction. The plateaued section of the channel may herein be referred to as the 'second region' 204 of the channel. The regions 202 and 204 may make up the plenum 130. FIG. 2 illustrates a set of electronic devices 102 (e.g., modules) to be cooled at the end of the channel, wherein the electronic devices are arranged along the x-direction in the card cage 107.

We note briefly that the x, y, and z directions are intended to be bidirectional. For example, the x direction above refers to the dimension along which the fans are arranged, and is not specifically either the 'left' or the 'right' direction (e.g., when viewed from behind the fans). Similarly, the y-direction refers to the vertical dimension (e.g., when viewed with the chassis predominantly oriented horizontally), perpendicular to the first direction, along which the fans are predominantly oriented, and the y-direction encompasses both the 'up' direction and the 'down' direction in this example.

FIG. 3 illustrates a similar chassis as FIG. 2, presented from a different view (bottom up view). In the illustrated embodiment, the chassis is shown from the y direction (i.e., the y direction comes directly into the plane of the image), oriented such that the fans 114 are located on the left. Air flow is again depicted by grey dashed lines. In the illustrated embodiment, it may be seen that many of the air flow lines do not travel in a straight line from the fans 114 to the modules 102. The average direction of air flow may be along the z-direction, as defined by the coordinate system, while individual air flows may include directions along the x and y-directions as well. The non-uniform nature of the air flow may cause the cooling to be unequally distributed.

In some embodiments, a chassis (such as a PXI chassis) may have slot-to-slot cooling disparities partially due to the fact that air exiting a typical electronics cooling fan has a swirl element associated with it. In these embodiments, the swirling air mixes prior to entering the card cage area in a non-uniform manner due to 3-dimensional mixing of the air. This non-uniform air flow pattern may provide some slots with more cooling than others.

FIG. 4 is a simulation of air flow near fans in an electronic chassis. As illustrated, the air flow that results from the three fans 114 is highly non-uniform, as air flow vortices from the fans lead to areas of both high and low air speeds and at various angles to the x-y plane. In some embodiments the fans may be axial fans, though other types of fans are also possible. This nonuniform air flow may cause some of the plug-in modules to receive insufficient cooling (e.g., those located in a relatively lower air flow region), potentially leading to overheating. Other plug-in modules may receive more air flow than is necessary for sufficient cooling (e.g., those located in a relatively faster air flow region), leading to power inefficiencies and/or higher levels of noise since the fans may be operating at a higher level of power consumption than would be necessary if the air flow was more spatially uniform.

FIG. 4 illustrates the velocity of air exiting cooling fans 114 using grey lines of varying darkness. The shade of grey indicates the speed of the air leaving the fan, with speeds ranging from, e.g., 0 (lightest grey) to approximately 50 ft/sec for a typical fan chassis (darkest grey), in some embodiments. Other types of fans with different distributions of air flow speed are also possible. In addition to the swirl described previously, and illustrated in the arrangement of the grey lines, the axial fans illustrated in this embodiment exhibit a zone of decreased air flow in the center of the fan. In some embodiments, an axial cooling fan may include a hub which does not generate air flow. This hub may lead to a zone of slower air flow in the center of the fan, as illustrated in FIG. 4.

The air flow from the fans 114 may proceed through the plenum 130, through the card cage 107, and out of the chassis 100.

Modular Card Cage Accessories

A modular cage card accessory may facilitate the function of and/or promote favorable conditions for one or more modules in a card cage 107. In order to facilitate the function and/or promote favorable conditions, the modular card cage accessory may include one or more components to perform any of various functions for one or more associated electronic modules. Example functions of a modular card cage accessory include functions related to thermal management (e.g., cooling and/or heating a module(s)), mechanical isolation (e.g., vibration management), mechanical support, accommodation for nonstandard module sizes (e.g., and/or shapes, designs, connections, etc.), electrical connections, and/or other functions. In some embodiments, the module(s) that the modular card cage accessory serves may be installed in an integrated mounting location (e.g., card guide) of the modular card cage accessory. In some embodiments, the module(s) that the modular card cage accessory serves may be installed in separate location from the modular card cage accessory, e.g., in an adjacent slot(s) to a slot(s) where the modular card cage accessory is installed.

Some example modular card cage accessories (e.g., modular diverters) may be designed to provide customized air flow for a controller or peripheral in order to improve cooling performance. In other words, a modular card cage accessory may divert or direct air flow to promote cooling of one or more portions of a module, e.g., a controller or a peripheral according to design characteristics (e.g., cooling requirements, etc.) of the module. For example, a modular card cage accessory may be configured to increase air flow speed to a portion of a module and/or to modify the direction of predominant air flow near a portion of a module.

Design considerations and/or characteristics of a module (e.g., related to thermal management) may include any or all of: heat sink location(s); heat sink size(s); heat sink orientation(s); impedance (e.g., of air flow); heat production location(s) and amounts; heat dissipation characteristics; materials; thermal conductivity; tolerance for high/low operating temperatures; tolerance for variability in operating temperature, structures present on the module which may block, reduce, channel, or otherwise impact air flow, etc. It will be appreciated that any or all of these considerations/characteristics may be associated with various portions or regions of the module. For example, a module may include one or more portions that are thermally sensitive (e.g., have more stringent operating temperature ranges). Such thermally sensitive components or regions may include processors or other electronic components, among various possibilities. A modular card cage accessory may adjust air flow to/around a module in order to meet the cooling requirements (and/or other air flow requirements) of the module in view of the various design characteristics and features of the module, the chassis, and other factors. In other words, a modular card cage accessory may be designed to cause air to flow in a custom or adjustable manner. Among various possibilities, a modular card cage accessory may reduce or otherwise modify fan swirl or other (e.g., undesirable) air flow characteristics. A modular card cage accessory may be associated with an individual module (e.g., a one-off, custom design), a class of modules (e.g., Extreme-Class controllers, or other groups/categories of modules), any modules with a common design consideration (e.g., a heat sink or thermally sensitive component in a particular location/area of the module, or a full chassis configuration (e.g., considering what modules are included in any of the various slots and making adjustments such as reducing air flow to superfluous, inactive, or empty slots or modules and/or increasing air flow to other slots or modules), etc.).

Thus, based on the design characteristics of a particular module, a particular, corresponding modular card cage accessory may direct air flow to a portion (or portions) of the module that would otherwise not receive sufficient air flow. For example, if (e.g., absent a modular card cage accessory) a processor or other thermally sensitive portion of a module may (under at least some conditions) reach a temperature that is outside of (e.g., higher) than its designed or preferred temperature range, a modular card cage accessory may be installed to direct increased air flow to a portion of the module containing the processor. For example, a modular card cage accessory may be designed to increase or redirect air flow toward (e.g., hard-to-reach) heat sink fins associated with the processor(s) of a module or toward the processor (or other thermally sensitive portion) itself. Similarly, the modular card cage accessory may be designed to provide improved alignment of the air flow with the heat sink fins. In other words, the modular card cage accessory may align air flow with the fins and reduce swirl at the fins and increase heat transfer from the fins to the flowing air. In some embodiments, the modular card cage accessory may adjust (e.g., increase, decrease, etc.) turbulence, e.g., to improve heat transfer. Further, the modular card cage accessory may be configured to reduce (or potentially increase) turbulence at a heat sink or other elements of a module. A modular card cage accessory may deflect air flowing in one direction (e.g., in the direction of flow in a plenum or channel) to a flow in a second direction (e.g., across a module, through the fins of a heat sink, etc.).

A modular card cage accessory may include any combination of vanes, fins, ducts, blades, grates, screens, fans, funnels, scoops, shields, blockers, and/or other elements to direct or modify air flow. Such elements may be referred to as air flow modifiers. Air flow modifiers may adjust air flow angle, direction, speed, turbulence, temperature, pressure, humidity, or other characteristics. As used herein, the terms block and scoop may refer to separate functions, but they are both examples of diverting air. In various cases blocking or scooping may divert air to different locations in a chassis and/or on a module, in other cases air may be diverted away from a module to another module. In some embodiments, a modular card cage accessory may block air, e.g., providing an air flow impedance thus "diverting" air to a different region on the given module and/or a neighboring slot. Scooping the air may be done with turning vane style features, e.g., to divert air flowing in one direction to another direction. Blocking may be done with a plug or other blocker, e.g., to block air from flowing through a particular region, thus increasing air flow in other regions. For example, air may be "scooped" toward a region where more air flow is desired, and/or "blocked" away from a region where air flow is less beneficial.

A modular card cage accessory may modify air flow in any number of slots. For example, in order to increase air flow to one module, a modular card cage accessory associated with a module may include a scoop, blocker, or other air flow modifier to redirect air from the same slot where the module is installed and/or an adjacent slot (or slots) to the module. In other words, the modular card cage accessory may cause air that would otherwise flow to the adjacent slot (or slots) to flow to the slot(s) of the corresponding module. For example, the modular card cage accessory may include a scoop to redirect air flow from one slot (e.g., which may or may not contain a module), to a second slot in order to provide additional air flow to a module in the second slot.

In some embodiments, a modular card cage accessory may direct air away from a module and/or towards the backplane. Such redirection may be based on design characteristics of a module. For example, such redirection may cool high power components or areas of the backplane, including connectors. In some (e.g., high power) modules, the power draw through the connectors may heat the connectors significantly. Cooling the connectors may increase power available to the module(s). Thus, cooling the backplane and/or connectors may increase power flow and performance of the module. There may also be standalone components on the backplane that are difficult to cool. Redirecting air to the backplane may help cool those components. Air through the card cage may be primarily focused on cooling modules and this may come at the expense of air flow to components on the card cage side of the backplane. Accordingly, a modular card cage accessory may be configured to promote cooling of components and/or connectors on the backplane instead of or in addition to one or more modules.

In some embodiments, a modular card cage accessory may come into direct contact with one or more components on a module. For example, such contact may be made for the purposes of electrical communication, thermal management, measurements, etc. A module touched by a modular card cage accessory may be located in the same slot as the modular card cage accessory or one or more adjacent slots, among various possibilities. For example, a modular card cage accessory may connect (e.g., thermally) a module to a heat sink(s) (e.g., located on the modular card cage accessory and/or another module).

In some embodiments, a modular card cage accessory may include a component to provide electrical connection(s) directly between multiple modules (e.g., without using the chassis backplane or other chassis components). For example, a modular card cage accessory may connect a sensor (e.g., on the modular card cage accessory or on a first module) to a second module. Further, a modular card cage accessory may provide a data connection between multiple modules. Such a data connection may provide for higher data rates and/or reduced latency relative to a connection via the backplane. Moreover, there may be a limited number of pins in the connectors between a module and the backplane. Thus, additional connections (e.g., of a module to another module(s) and/or modular card cage accessory) could allow modules with signal requirements in excess of those allowed for by the backplane connectors to communicate with one another, e.g., allowing for increased signaling, communication, coordination, measurement, etc., between modules.

Further, instead of or in addition to an electrical connection to facilitate communication, coordination, or measurement between modules, a modular card cage accessory may provide a connection directly to the modular card cage accessory. Such a connection may facilitate a better grounding path for electrostatic discharge (ESD) and/or may power components or sensors on the modular card cage accessory itself. These components might for example be motors that facilitate a mechanical adjustment of the modular card cage accessory to redirect air flow and/or make (e.g., or break) thermal, mechanical, and/or electrical contact with a sensor, heat sink, etc. of a module.

In some embodiments, the modular card cage accessory may also be able to make electrical contact with a connector on the backplane to facilitate chassis level control of the configuration of the accessory.

In some embodiments, a modular card cage accessory may change shape and/or configuration in the presence of an associated module. For example, such a change may be achieved using motors (e.g., of the modular card cage accessory) or mechanical actuation resulting from plugging the module in. For example, a modular card cage accessory may include sensors, motors, actuators, etc. to respond to the installation of the modular card cage accessory and/or an associated module in order to cause the modular card cage accessory to assume an operating configuration when the modular card cage accessory and/or module are installed in the chassis in one or more associated slots. Such a change may lock the module in place for robustness and/or may configure the modular card cage accessory to more effectively conform to the module for some other purpose (e.g., touching a component of the module to cool it once the module is plugged in, connecting a sensor, etc.). It will be appreciated that such changing shape and/or configuration need not result from the mechanical actuation of plugging the associated module in. Instead, the change could be electrically directed by the backplane (e.g., by the controller, and/or other module) if the chassis notices the module is plugged in once the chassis is turned on. Further, the change could be electrically directed by the associated module.

For example, a modular card cage accessory may provide cooling to a module using a direct physical connection. In some embodiments, such a direct physical connection may be established by a change in shape of the modular card cage accessory resulting from the presence of a module. For example, a modular card cage accessory may include a heat sink and an extension to connect the heat sink to the module (e.g., to a portion of the module which may have a cooling requirement, e.g., which may not be satisfied by any heat sink(s) of the module). Thus, the modular card cage accessory may be configured to provide supplemental, targeted cooling to the module (or a thermally sensitive portion) by providing an additional heat sink connected to the module via the extension.

As another example, a change in shape of the modular card cage accessory may place a sensor in contact with a module or in another appropriate position (e.g., in the slot and/or adjacent slot(s)). The sensor connection may include a mechanical, electrical, communication, and/or thermal connection. The connection may draw power and/or provide power.

As another example, a change in shape of the modular card cage accessory may move a duct, air flow diverter, and/or other component into place. In this example, the component may start in a first (e.g., installation) position (e.g., out of the way, perhaps folded down into the plenum or into an adjacent empty slot, etc., e.g., because being in a second (e.g., operating) position would prevent installation of the modular card cage accessory and/or the associated module by blocking its path to the backplane due to geometry on the surface of the module). Upon installation or other actuation, the component may move into the second (operating) position). The component may be configured to move out of the way (e.g., return to the first position) to allow the module and/or modular card cage accessory to be removed from the chassis.

In some embodiments, a modular card cage accessory may include instruments or gauges, e.g., for measuring parameters related to cooling, among various possibilities. For example, a modular card cage accessory may include instruments for measuring air speed, flow direction, temperature, etc. A modular card cage accessory may include one or more attachment points for mounting such instruments.

In some embodiments, a modular card cage accessory may be adjustable. For example, adjustments may include angle or position of one or more vanes, size (e.g., width, radius, etc.) of an opening, direction or size of a duct, etc. Such adjustments may be made automatically (e.g., based on measurements or forces on a modular card cage accessory and/or associated module) or manually (e.g., by a user). For example, a modular card cage accessory may receive a measurement signal (and/or perform measurement(s)) related to temperature and/or air flow speed or direction and may make an adjustment in response to the measurement signal (or measurement(s)), e.g., based on comparing a measurement to a target value or threshold. Further, a modular card cage accessory may be configurable for different modules (e.g., potentially related modules in a family) which may have different geometries and/or cooling requirements.

In some embodiments, a modular card cage accessory may consist of multiple pieces. For example, a modular card cage accessory may be built out of various modular card cage accessory components, e.g., from a system of such components. Such components may include: mounting features, card guides, structural components (e.g., a frame), air flow components (e.g., vanes, ducts, etc., which may be fixed or adjustable), gauges, instruments, etc. Thus, a user of a chassis may construct a custom modular card cage accessory from a system or kit of such components. Similarly, such a system/kit may be used to modify a modular card cage accessory.

In some embodiments, a modular card cage accessory may be configured to accept air from outside of the chassis and direct the air into the card cage, e.g., to provide cooling for a module in the card cage. For example, the modular card cage accessory may include one or more duct(s) and/or hole(s) in a front panel to accept air from the front of the chassis. The modular card cage accessory may further include a fan or other means for increasing air flow. In some embodiments, passive air flow techniques may be used.

In some embodiments, a modular card cage accessory may be configured to direct air flow from inside the chassis out the front (e.g., and/or side(s), back, top, bottom) of the chassis.

In some embodiments, a source of pressurized air (e.g., a tank, compressor, etc.) may be used by a modular card cage accessory to provide cooling for a module. For example, such a source of pressurized air may be located inside the card cage (e.g., mounted on the modular card cage accessory and/or separately from the modular card cage accessory). Alternatively, the source of pressurized air may be located outside of the card cage. The modular card cage accessory may accept air from the (e.g., internal or external) source of pressurized air and direct the air toward an associated module (or modules). The modular card cage accessory may direct the air toward a heat sink, thermally sensitive portion, or other portion/component of the module(s). In some embodiments, the pressurized air may be used in response to a condition. For example, the modular card cage accessory may direct pressurized air toward a module in response to determining that the module (or a component of the module) has reached a temperature threshold and/or that performance of the module has degraded (e.g., reached a performance threshold).

In some embodiments, a modular card cage accessory may be configured and/or designed to provide additional functions (e.g., in addition to diverting cooling air). For example, a modular card cage accessory may include or support elements such as one or more of: cooling loops, heaters, heat exchangers, electromagnetic interference (EMI) shielding, sensors, blockers (e.g., a slug to align a module in the slot, e.g., to align with a card guide), mechanical isolators, vibration dampers, etc. A modular card cage accessory may include a mounting fixture(s) for one or more of such additional elements. Such elements may be positioned to perform their function for a module associated in with the modular card cage accessory, e.g., whether the module is installed in the same or a different slot than the modular card cage accessory. For example, a modular card cage accessory may provide EMI shielding for a module installed in the same slot and/or an adjacent slot. It will be appreciated that a cooling loop may refer to an apparatus for receiving cooled liquid from a source that goes through a heat exchanger (e.g., downstream of the slot) thus chilling the air prior to entering the module slot or prior to flowing through a heat sink, toward a thermally sensitive component, etc. The cooled liquid may (e.g., also or alternatively) cool the card guide integrated into the accessory which could help cool the module (e.g., circuit board edges, connectors, etc.).

Figure 5:
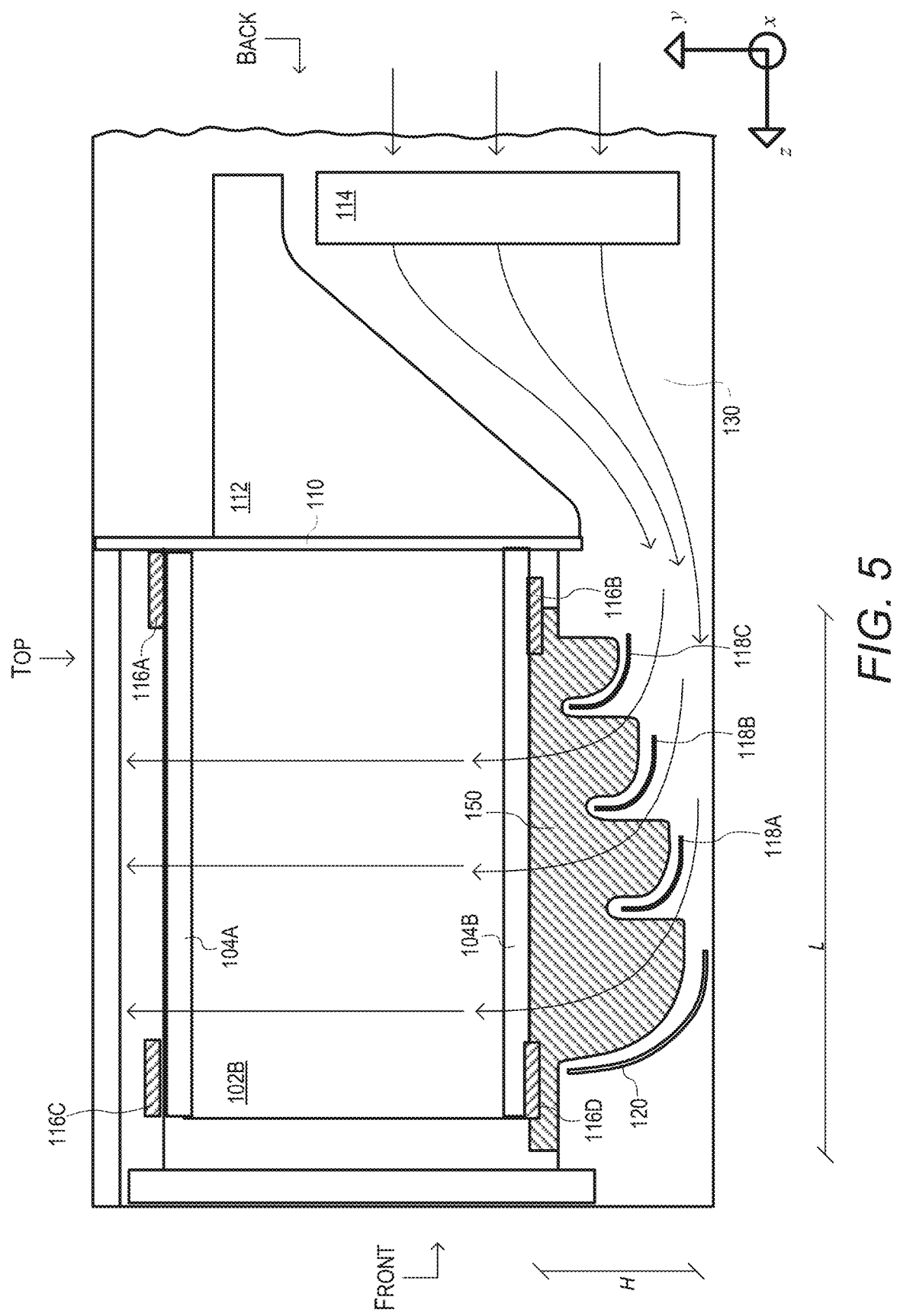
FIGS. 5-7 are diagrams illustrating potential locations for a modular card cage accessory within a chassis, according to some embodiments.
Figure 6:
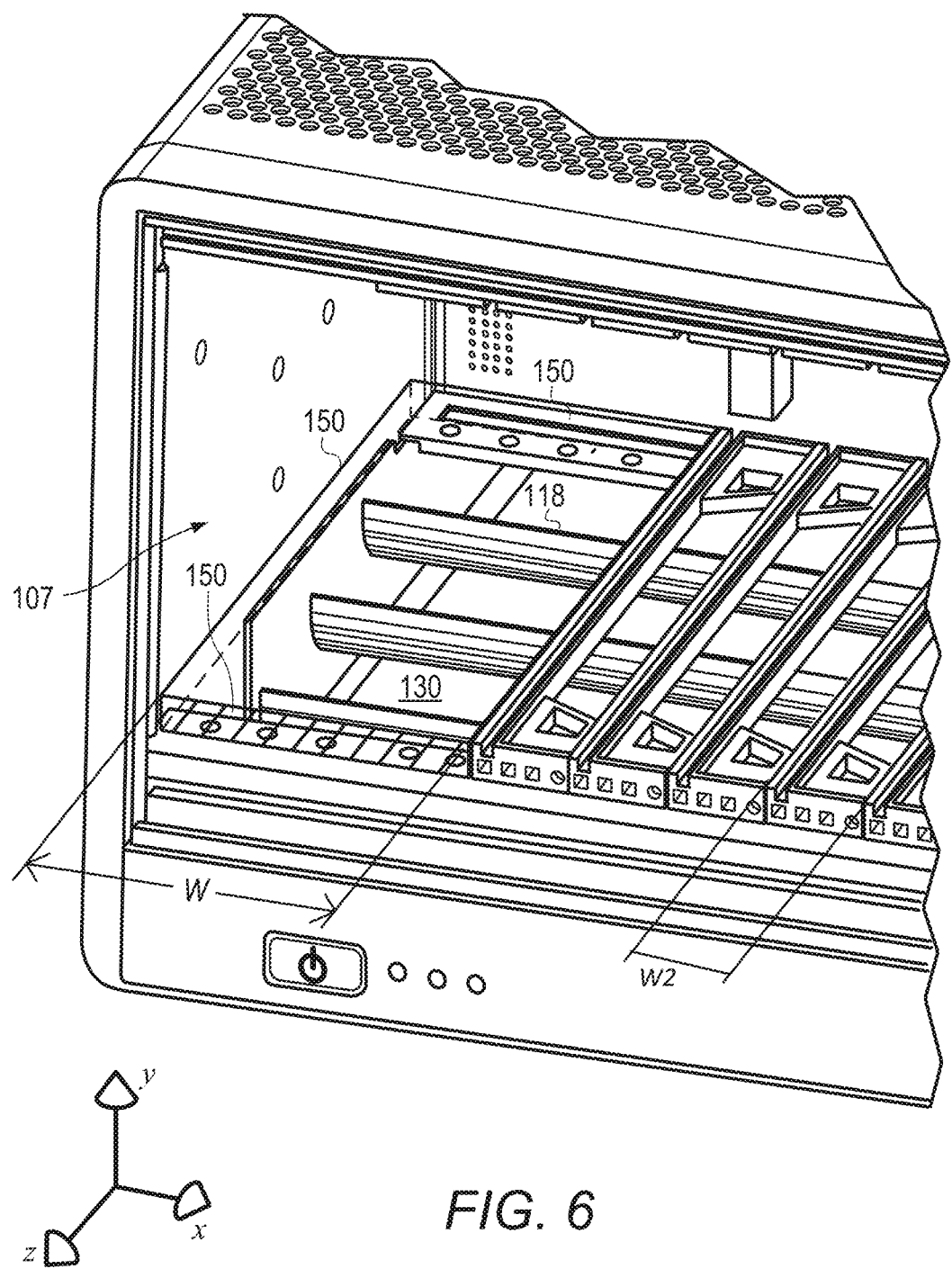
Figure 7:
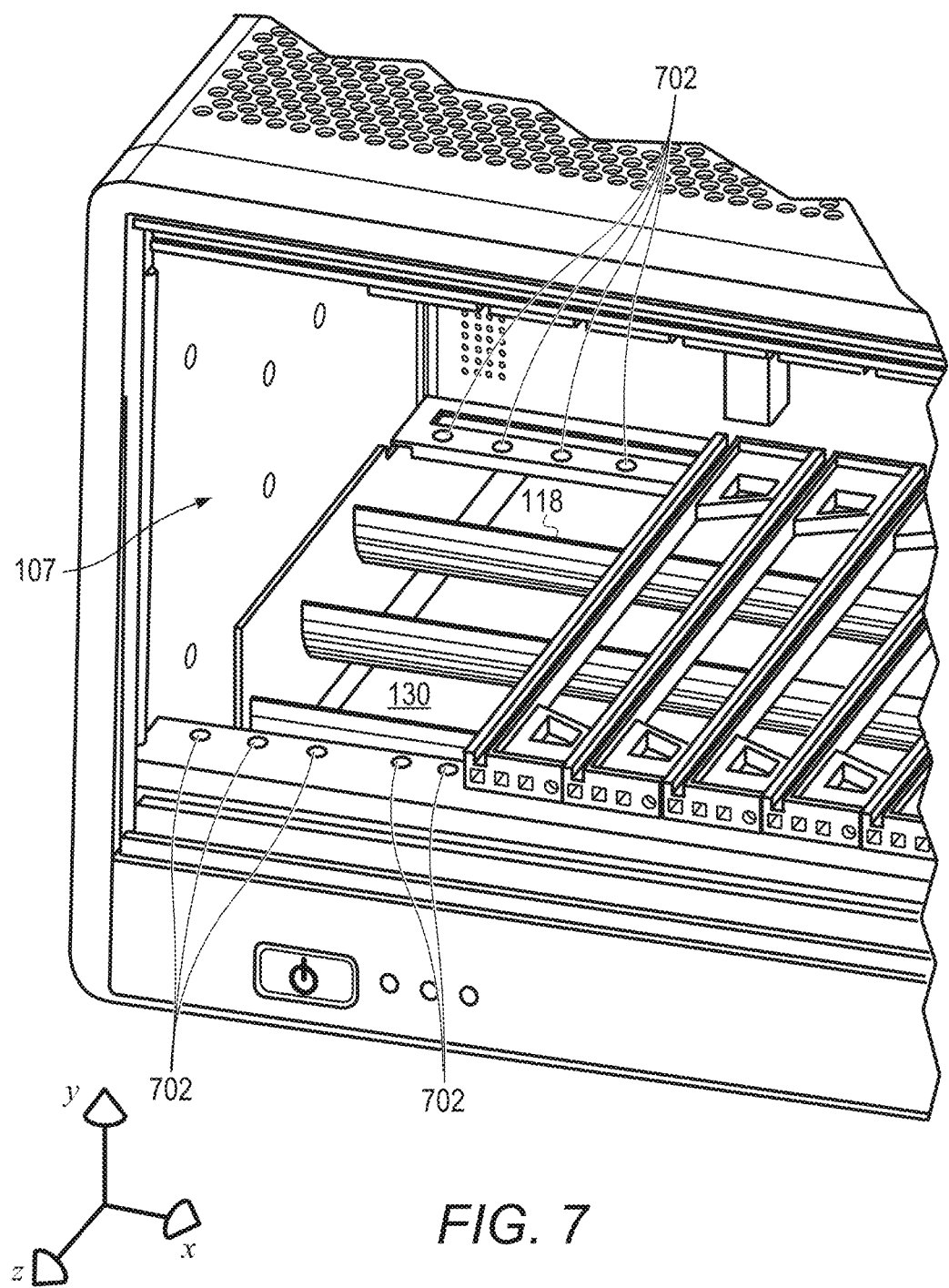

FIGS. 5-7—Modular Card Cage Accessory Placement

FIG. 5 illustrates a region in a chassis 100 (shown in a side view) where a modular card cage accessory may be installed, according to some embodiments. FIG. 5 is similar to FIG. 1B with a highlight to illustrate an exemplary "keep in zone" 150 (e.g., a region where the modular card cage accessory or accessories may be installed), according to some embodiments. As shown, a modular card cage accessory may span length, L, e.g., in the z dimension and height, H, e.g., in the y direction. Additionally, the modular card cage accessory may extend (e.g., hang down) into a turning vane assembly (e.g., between vanes 118A, 118B, 118C, and deflector 120) or more generally into the plenum 130. As illustrated in FIG. 5, the zone 150 may extend in the x direction for the width of the chassis 100, e.g., for as many module 102 and slots as may be included in the chassis. Thus, any number of modular card cage accessories may be installed in the chassis (e.g., typically up to 1 modular card cage accessory per slot). In some embodiments, multiple modular card cage accessories per slot may be installed in the chassis. It will be appreciated that some modular card cage accessories may extend outside of zone 150, e.g., out of the front of the chassis, etc. Further, some chassis may not include vanes 118. The zone 150 may be different for different chassis designs.

For example, a modular card cage accessory may include turning vanes (not shown in FIG. 5) that may supplement the air turning of the turning vanes 118A, 118B and deflector 120, if those components are included in the chassis. It will be appreciated that some chassis may not include vanes 118 and/or deflector 120, and that a modular card cage accessory may include vanes to redirect air flow. Alternatively, or additionally, a modular card cage accessory may include vanes configured to focus or direct air to a particular region of a module 102. For example, a modular card cage accessory may be configured to block or scoop air flow away from one region and/or direct the air flow to another region.

FIG. 6 further illustrates the zone 150, according to some embodiments. FIG. 6 provides a front view of the chassis 100 looking inside card cage 107, and highlights the 3-dimensional space (e.g., zone 150) for a modular card cage accessory associated with a controller slot. As shown, the controller slot may be an expansion slot, e.g., it may be wider than the slots for peripherals. For example, the modular card cage accessory may be as wide as the slot, e.g., up to width, W, in the x direction. A modular card cage accessory for a single (e.g., peripheral) slot may be as wide as W2. It will be appreciated that a modular card cage accessory may be any width, e.g., less than one slot wide (e.g., less than W2) or wider than one slot.

Further, it will be appreciated that the zone 150 depicted in FIGS. 5 and 6 is exemplary only. For example, some modular card cage accessories may extend into card cage 107, e.g., potentially all the way to the top of the card cage 107. For example, some modular card cage accessories may extend to upper card guide side 104A. Similarly, although the illustrated zone 150 is described with respect to modular card cage accessories installed in the bottom of a slot (e.g., with respect to the orientation of FIG. 1B, etc.), some modular card cage accessories may be installed in the top, front, and/or back of a slot, according to some embodiments.

FIG. 7 illustrates how a modular card cage accessory may be held in place in the card cage 107 of chassis 100, according to some embodiments. As shown, mounting features (e.g., holes, slots, tabs, connectors, pins, clips, pegs, etc.) 702 may be included in sub-rack support members 116B and 116D (e.g., the support members supporting the card guide side 104B that are closer to the plenum 130, e.g., the lower support members in the orientation of FIG. 7). It will be appreciated that the mounting features may be located on the top and/or bottom of the card cage 107. Note that card guide side 104A and card cage support members 116A and 116C may be hidden from view in FIGS. 6 and 7.

The mounting features 702 may be used to mount the modular card cage accessory in the card cage 107 of the chassis 100. Further, mounting features 702 may also be used to mount blockers (e.g., to align a module with the slot). Additionally, or alternatively, the modular card cage accessory may provide the blocking function. The chassis 100 may include any number of mounting features 702 for controller and/or peripheral slots. Any number of the mounting features 702 may be used to mount modular card cage accessories, blockers, and/or other elements. Not all of the mounting features 702 may be used. For example, a slot that does not include a modular card cage accessory may have one or more unused mounting features 702.

It will be appreciated that a chassis 100 may include sufficient and appropriate mounting features 702 to support a modular card cage accessory. For example, mounting holes (e.g., for blockers or other elements) already present on the chassis may be used to mount a modular card cage accessory. In some embodiments, chassis 100 may be modified to include additional mounting features 702 to accommodate a particular modular card cage accessory (or type of accessories, etc.). Similarly, aspects of mounting features 702 may be designed (or modified) to support a card cage accessory. For example, spacing between particular mounting features 702 may be configured to attach a particular modular card cage accessory or type of accessory.

The modular card cage accessory may have corresponding mounting features (e.g., holes, slots, tabs, connectors, pins, clips, pegs, etc.) to connect to the mounting features 702 of chassis 100. For example, the modular card cage accessory may be connected with screws, bolts, clips, etc. to the mounting features 702.

In some embodiments, the modular card cage accessory may be installed in place of (e.g., instead of) one or more card guides 104 (e.g., or card guide sides 104A-B). For example, one or more card guides 104 may be removed from a chassis to accommodate the modular card cage accessory. A chassis 100 may be provided without one or more card guides 104. Thus, a modular card cage accessory may be installed in the place(s) of card guides for one or more (e.g., adjacent) slots.

In some embodiments, the modular card cage accessory may include one or more card guides 104 for attaching one or more modules. Thus, the modular card cage accessory may replace (e.g., like for like and/or with modifications) card guides which would otherwise exist in a chassis. In some embodiments, the modular card cage accessory may include card guides for attaching multiple accessories, e.g., in one or more slots.

Figure 8:
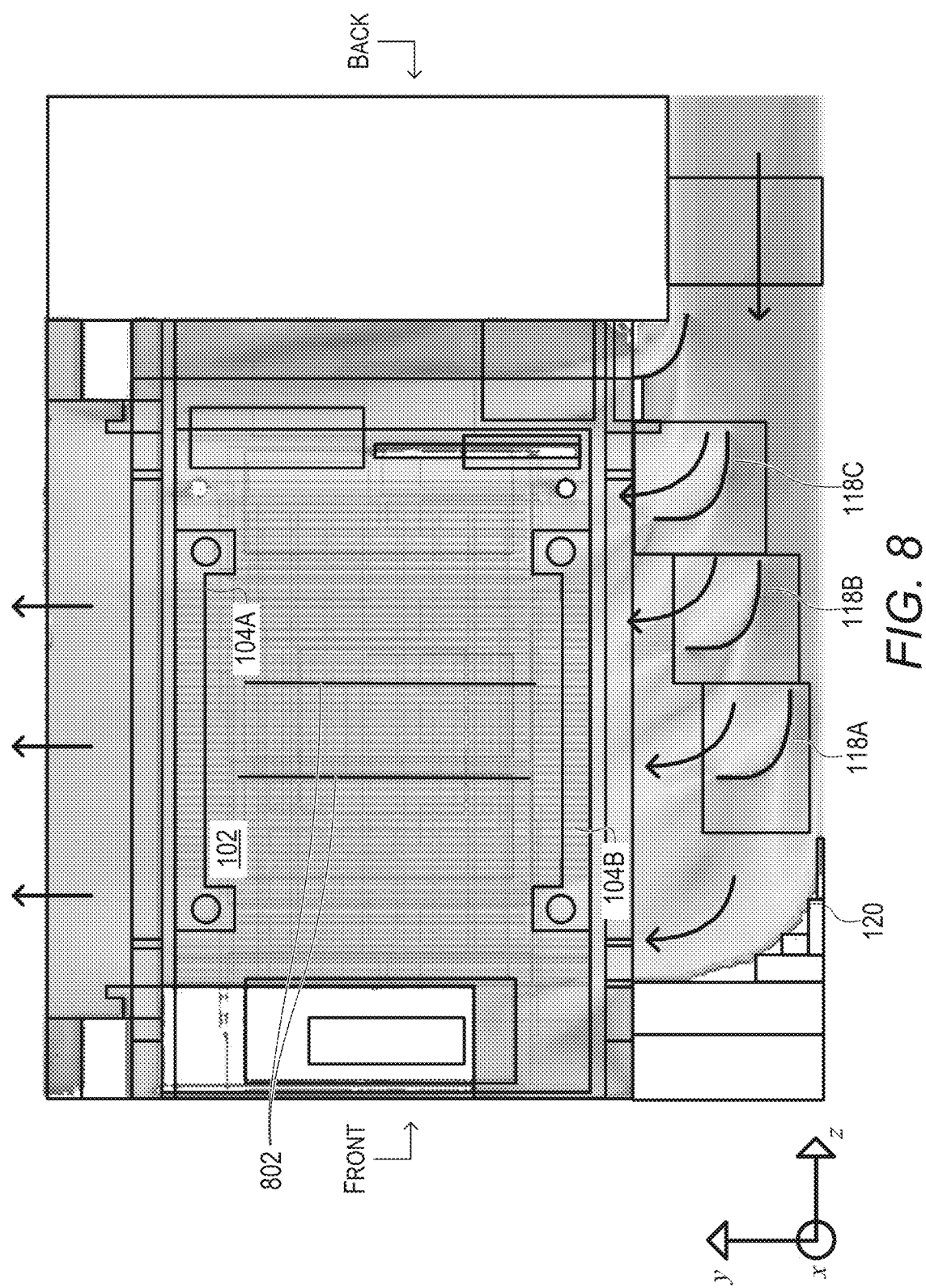
FIG. 8 is a diagram illustrating an exemplary heat sink, according to some embodiments.

FIG. 8—Exemplary Heat Sink

FIG. 8 illustrates air flow through an exemplary heat sink (e.g., of a module 102, e.g., a controller or peripheral), according to some embodiments. As shown, the turning vanes 118 and deflector 120 may not turn the air flow a full 90 degrees (e.g., from the z direction in the plenum to the y direction to be parallel to heat sink fins 802). Accordingly, the air flow may not be fully lined up with the fins 802 and may be slow relative to air flow that better aligns with the fins 802. Thus, a modular card cage accessory may include or otherwise act as turning vanes (e.g., primary turning vanes or supplemental to vanes included in the chassis) and provide further deflection to turn the air flow into the y direction and align with the heat sink fins 802. By providing better aligned air flow in the y direction through the heat sink fins 802, the modular card cage accessory may improve the cooling performance of the heat sink fins 802. Note that any number of heat sink fins 802 may be included.

As noted above, in some embodiments, a modular card cage accessory may be configured to increase air flow in one area relative to another. Guiding air to one area, such as a heat sink, may be referred to as ducting. In other words, a modular card cage accessory may reduce heat sink air flow bypass, e.g., by channeling a larger fraction of a slot's (or multiple slots') air flow to a heat sink or an area of a module that would benefit from more cooling.

In some embodiments, the modular card cage accessory may be designed so that any reduction in pressure drop (and thus air flow/speed) may not offset the benefits of the diversion. For example, the benefits of improving air direction over heat sink fins may provide improved cooling to some component(s), e.g., which may be critical/sensitive.

Figure 9:
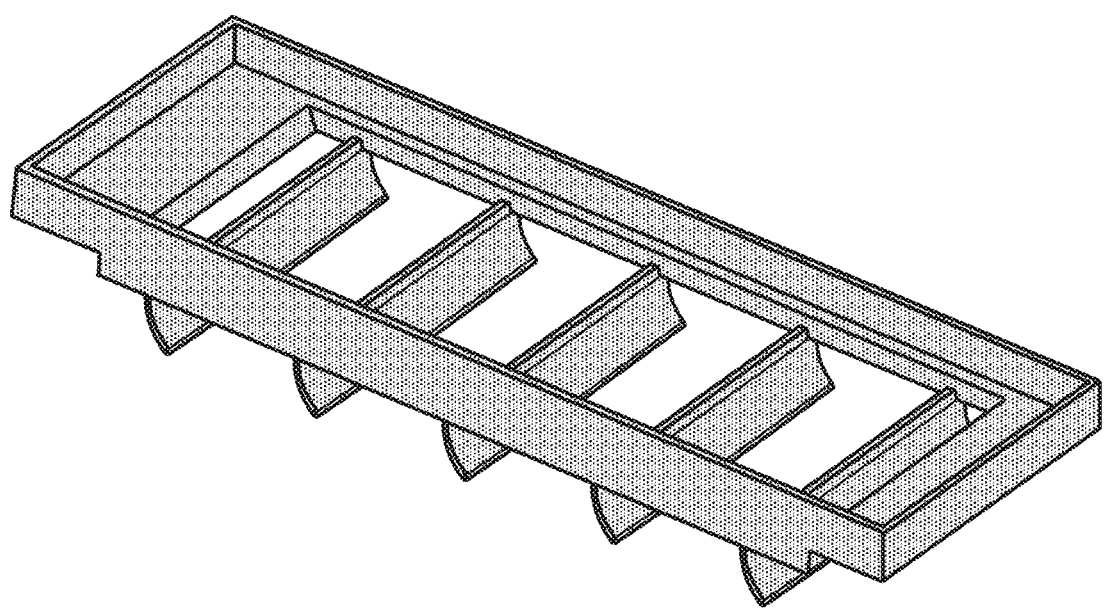
FIGS. 9 and 10 are diagrams illustrating an exemplary modular card cage accessory, according to some embodiments.
Figure 10:
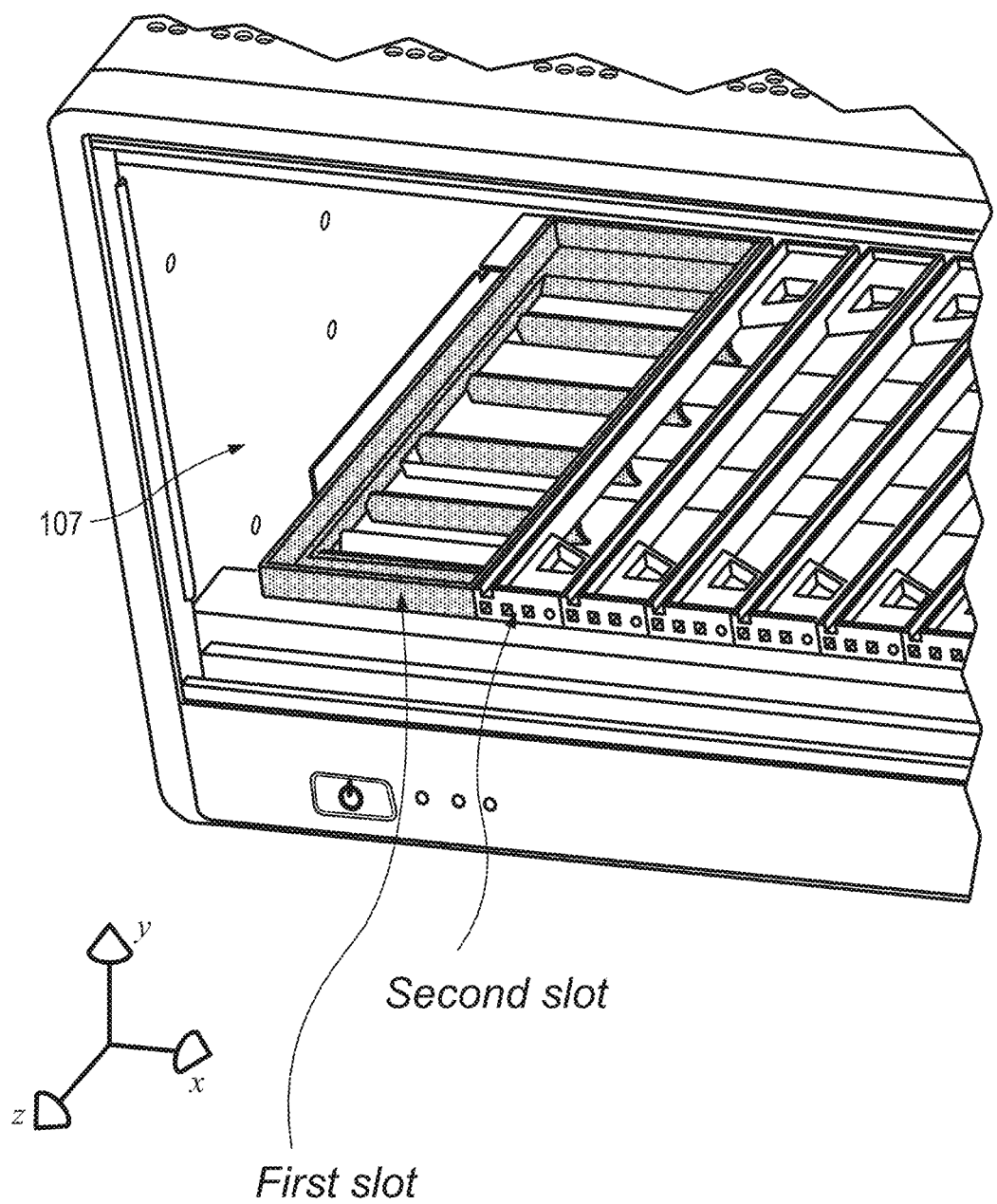

FIGS. 9 and 10—Exemplary Modular Card Cage Accessory

FIG. 9 illustrates an exemplary modular card cage accessory, according to some embodiments. This exemplary modular card cage accessory may be a modular diverter configured to provide additional turning vanes, e.g., to redirect the flow of air to be more parallel to heat sink fins 802. In other words, this exemplary modular card cage accessory may divert or deflect air flowing in one direction to flow in a different direction (e.g., perpendicular to the first direction).

FIG. 10 illustrates the exemplary modular card cage accessory of FIG. 9 installed in a controller expansion slot of card cage 107 of chassis 100. In this exemplary installation, the vanes of the modular card cage accessory may complement the fixed turning vanes and deflector to increase the turn or deflection of the air flow, e.g., relative to the direction of flow in the plenum. As noted above, not all chassis may include fixed turning vanes and/or deflector, so the vanes of the modular card cage accessory may be the only turning vanes, according to some embodiments.

Figure 11:
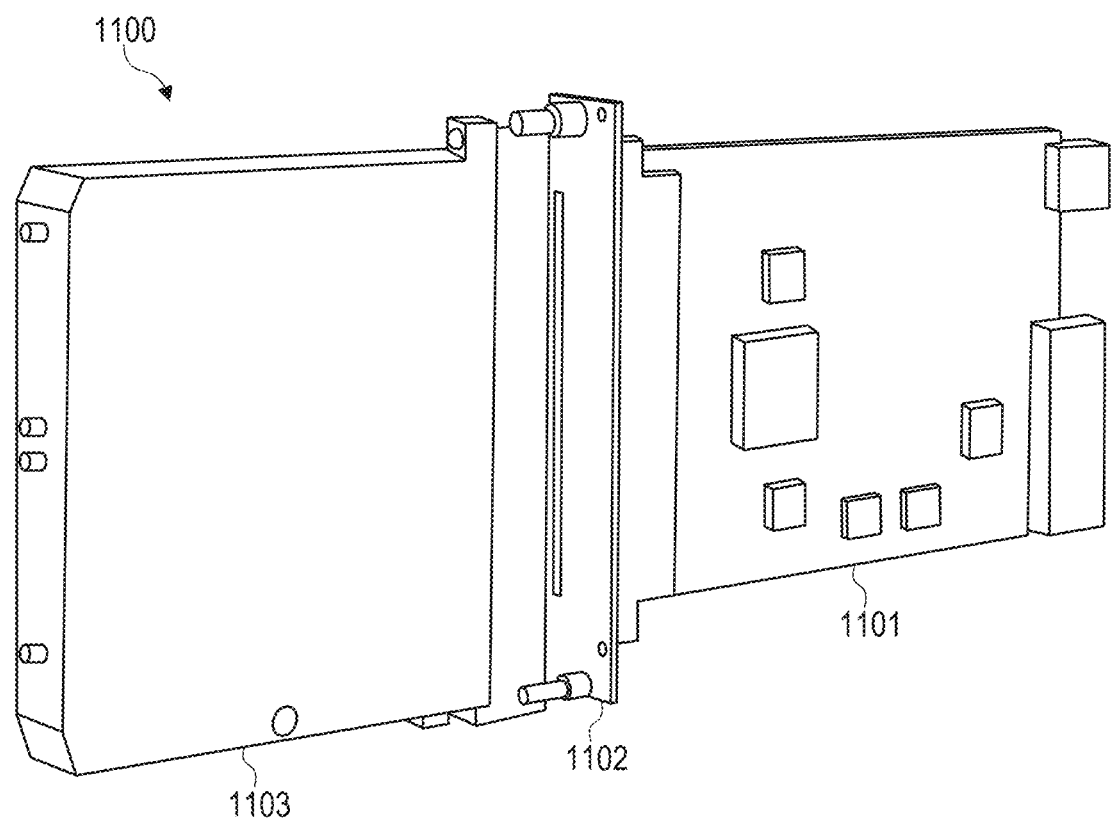
FIG. 11 is a diagram illustrating an exemplary module with an external portion, according to some embodiments.

FIG. 11—Cooling an External Component

In some embodiments, a modular card cage accessory may direct air from inside the card cage of a chassis out the front (e.g., and/or back, top, side(s), etc.) of the chassis to cool one or more peripheral, external module, portion of a module(s), or module components outside of the chassis. For example, air may be directed toward external peripherals, which may be plugged into modules. For example, a modular card cage accessory may include a duct, fins, scoop, etc. to direct air from the plenum 130 out (e.g., though the front, etc.) of the card cage to an external module (e.g., a module such that a portion or all of the module is outside of the chassis). The air flow may leave the chassis via a module front panel or panels (e.g., in the slot(s) including the modular card cage accessory, in the slot(s) including the external module or a module that attaches to the external module, and/or of one or more adjacent slots). The module front panel(s) may include a hole(s) or a standalone duct(s). In some embodiments, a modular card cage accessory may be or include a duct to direct air from the plenum out of a front panel and toward an external component. An external module may include an external portion that may or may not be present at all times. For example, an internal portion of the external module may be mounted inside the chassis and an external component may be removable (e.g., for maintenance, for exchange of external components, when a function of the external component is not needed, for transport of the chassis, etc.). In some embodiments, the modular card cage accessory may provide the external air flow when the external portion is present and may not provide the external air flow when the external portion is not present.

For example, a modular card cage accessory may be used to help cool a FlexRio Adapter Module (FAM), e.g., a module that plugs into an NI PXI FlexRIO card to do further processing and input/output. There may be active components inside the FAM and thus thermal management may be beneficial.

FIG. 11 illustrates an example module 1100. As shown, the module 1100 includes an internal portion or card 1101, a module front panel 1102, and an external portion or component 1103. Internal portion 1101 may be installed inside chassis 100 and external portion 1103 may be outside (e.g., in front of) the chassis 100. In some embodiments, a modular card cage accessory may direct air from inside the chassis 100 toward external portion 1103, e.g., via a duct and/or one or more holes in the module front panel 1102 and/or a module front panel associated with one or more slots where the modular card cage accessory is mounted.

Figure 12:
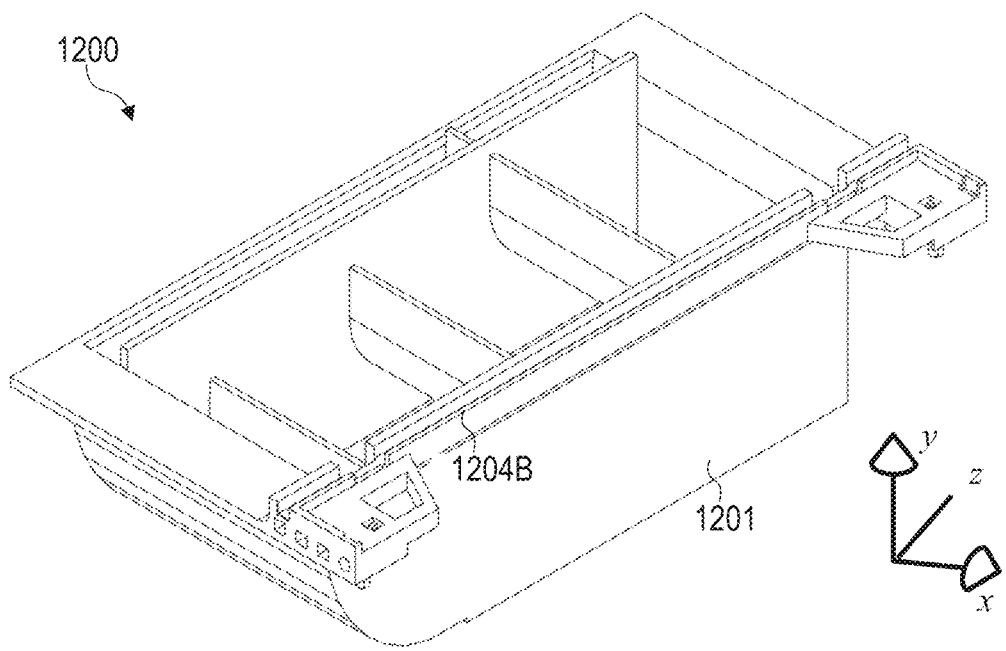
FIGS. 12 and 13 are diagrams illustrating an exemplary modular card cage accessory including a scoop and integrated card guide, according to some embodiments.
Figure 13:
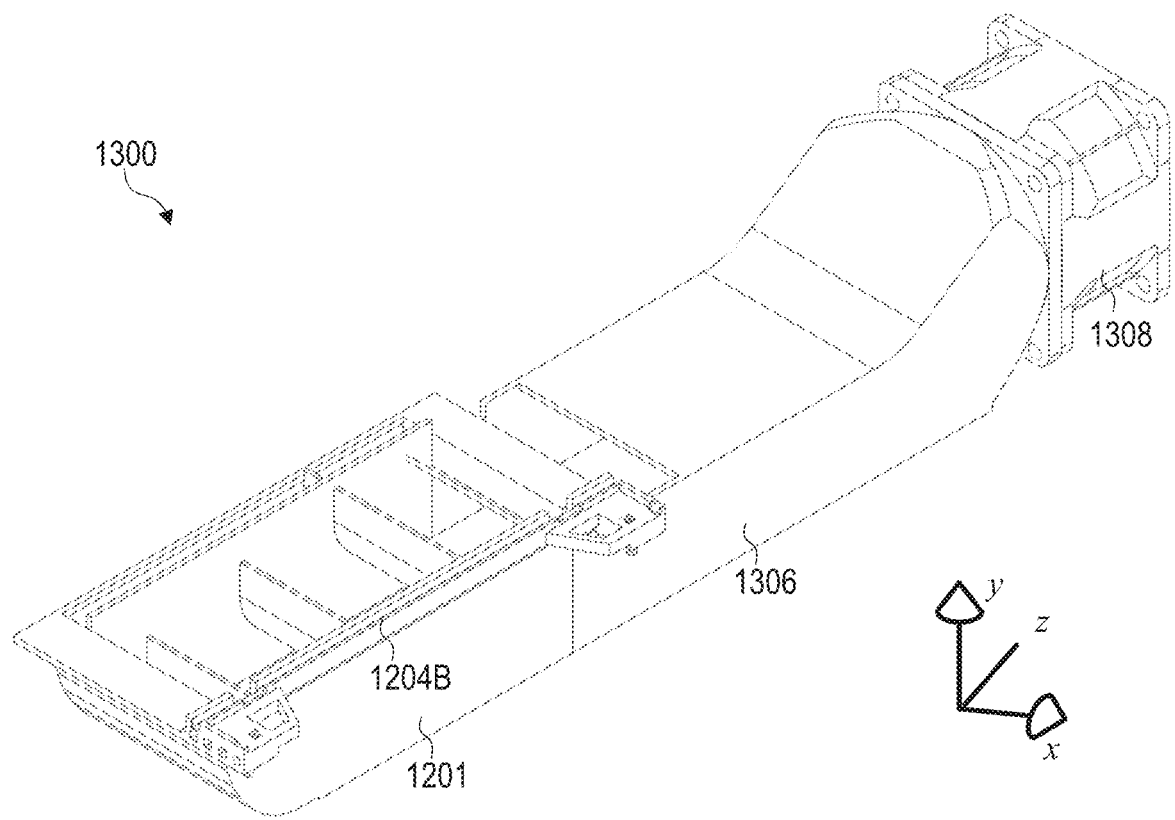

FIGS. 12 and 13—Scoop and Card Guide

FIG. 12 illustrates an exemplary modular card cage accessory 1200, according to some embodiments. This exemplary modular card cage accessory may be a modular diverter configured to provide additional air flow to an associated module. The modular card cage accessory may be configured for installation in a slot of chassis 100, e.g., a controller slot. As shown, the modular card cage accessory may include a scoop 1201, e.g., to increase the air flow through the controller slot. Further, the modular card cage accessory may include an integrated card guide 1204B. The integrated card guide 1204B may serve a similar purpose to a card guide of the chassis 100 (e.g., lower card guide side 104B). In other words, an associated module 102 (e.g., a controller or a peripheral) may be installed in card guide 1204B (e.g., in combination with upper card guide side 104B, not shown in FIG. 12). Note that the scoop 1201 may also include turning vanes and/or other features to direct air flow toward or away from particular areas of the associated module.

FIG. 13 illustrates an exemplary modular card cage accessory 1300, according to some embodiments. Modular card cage accessory 1300 may be similar to modular card cage accessory 1200, however modular card cage accessory 1300 may further include a duct 1306 and a fan 1308. For example, the duct 1306 and fan 1308 may be installed in plenum 130. The scoop 1201 may cap the duct 1306. The modular card cage accessory 1300 may direct air flow generated by the fan 1308 and/or any fans (e.g., 114) of the chassis to an associated module 102.

It will be appreciated that the combination of features of FIGS. 12 and 13 are exemplary. For example, a modular card cage accessory could include scoop 1201, duct 1306, and fan 1308, but not include an integrated card guide. For example, such a modular card cage accessory may allow for an associated module to be installed using any existing card guide(s) 104 of the chassis. Similarly, the duct 1306 may be included without a fan 1308 so that the duct may direct a (e.g., larger) portion of the air flow generated by any fan(s) 114 of the chassis to the associated module 102.

FIGS. 14-17—Modular Card Cage Accessory Providing Electrical Connection

FIGS. 14-17 illustrate a set of embodiments where the top card guide may be replaced with a modular card cage accessory that enables electrical connectivity between adjacent modules and/or between a module and the backplane.

Figure 14:
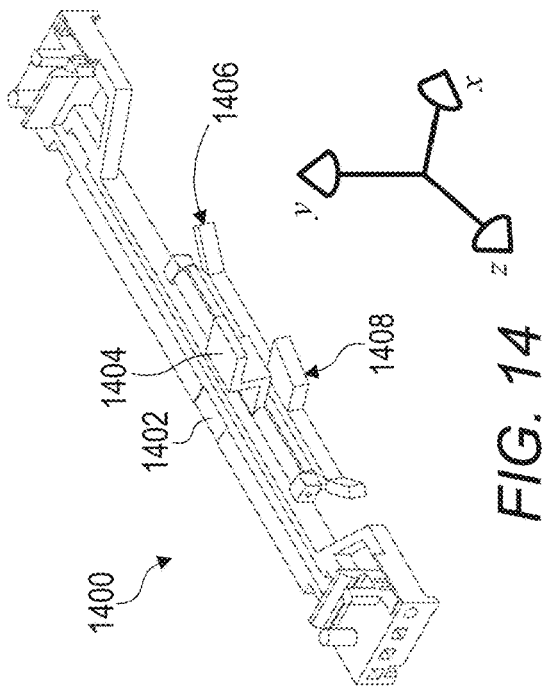
Figure 16:
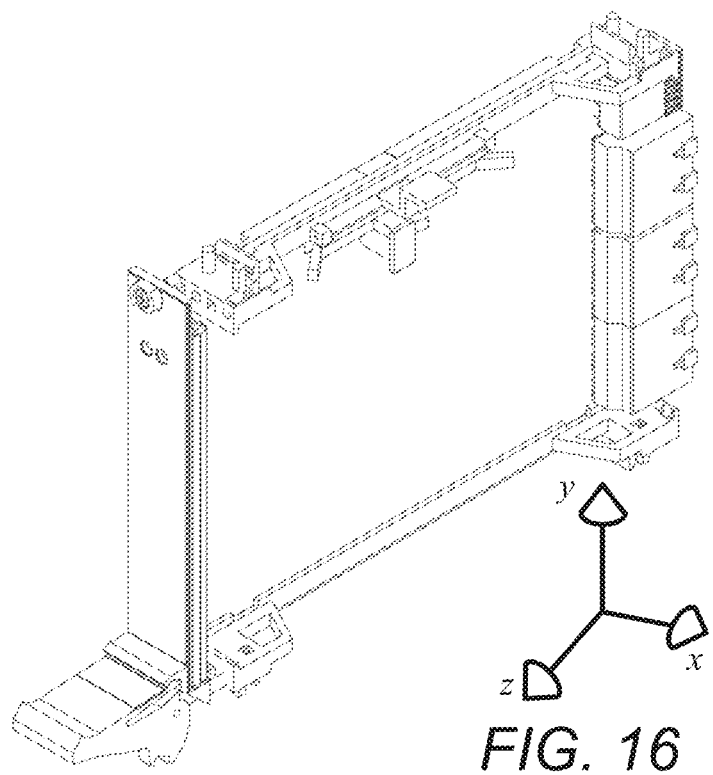
Figure 17:
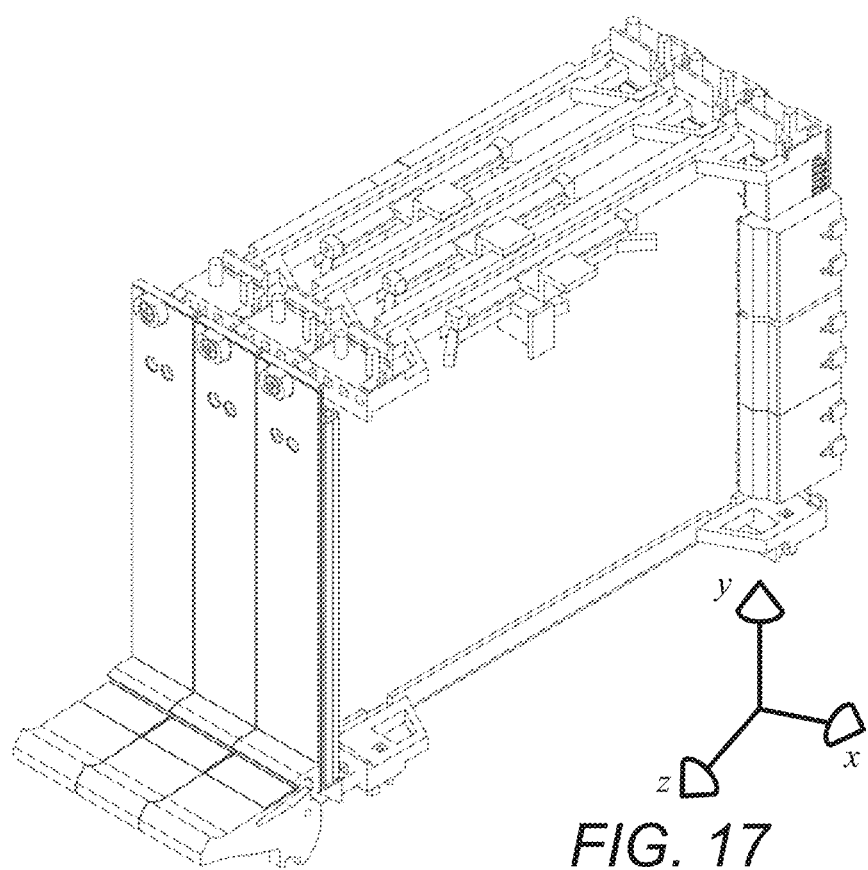

FIG. 14 illustrates an exemplary modular card cage accessory 1400, according to some embodiments. This exemplary modular card cage accessory may plug into the top of a first slot. The modular card cage accessory may include a card guide feature which may also include an area populated by electrical contacts 1402. Also, the modular card cage accessory may include a hinge-like (e.g., rotating) structure 1406 which may pivot around its long axis to form and break connections with a module in a second (e.g., adjacent) slot and/or to allow a module to plug or unplug into the first slot. Structure 1406 may be spring loaded to control its neutral position. Structure may include a connector 1404. On the far side (e.g., underside) of connector 1404, there may be electrical connections that can communicate with the card guide in the second (e.g., adjacent) slot. For example, connector 1404 may electrically connect to electrical contacts 1402 of a similar modular card cage accessory in the second slot and a module is populated, as shown in FIGS. 16 and 17.

Further, the visible side (e.g., top side) of connector 1404 may include or accommodate an arbitrary additional connector (not shown). Such an additional connector may plug into a cable which goes to the backplane or another accessory, among various possibilities. This additional connector may be in addition to a connection between connection 1404 electrical contacts 1402 (e.g., of a modular card cage accessory in the second slot).

The structure 1406 may further include a mechanical connector 1408, e.g., for locking to or otherwise establishing a secure connection with an associated module, according to some embodiments.

Figure 15:
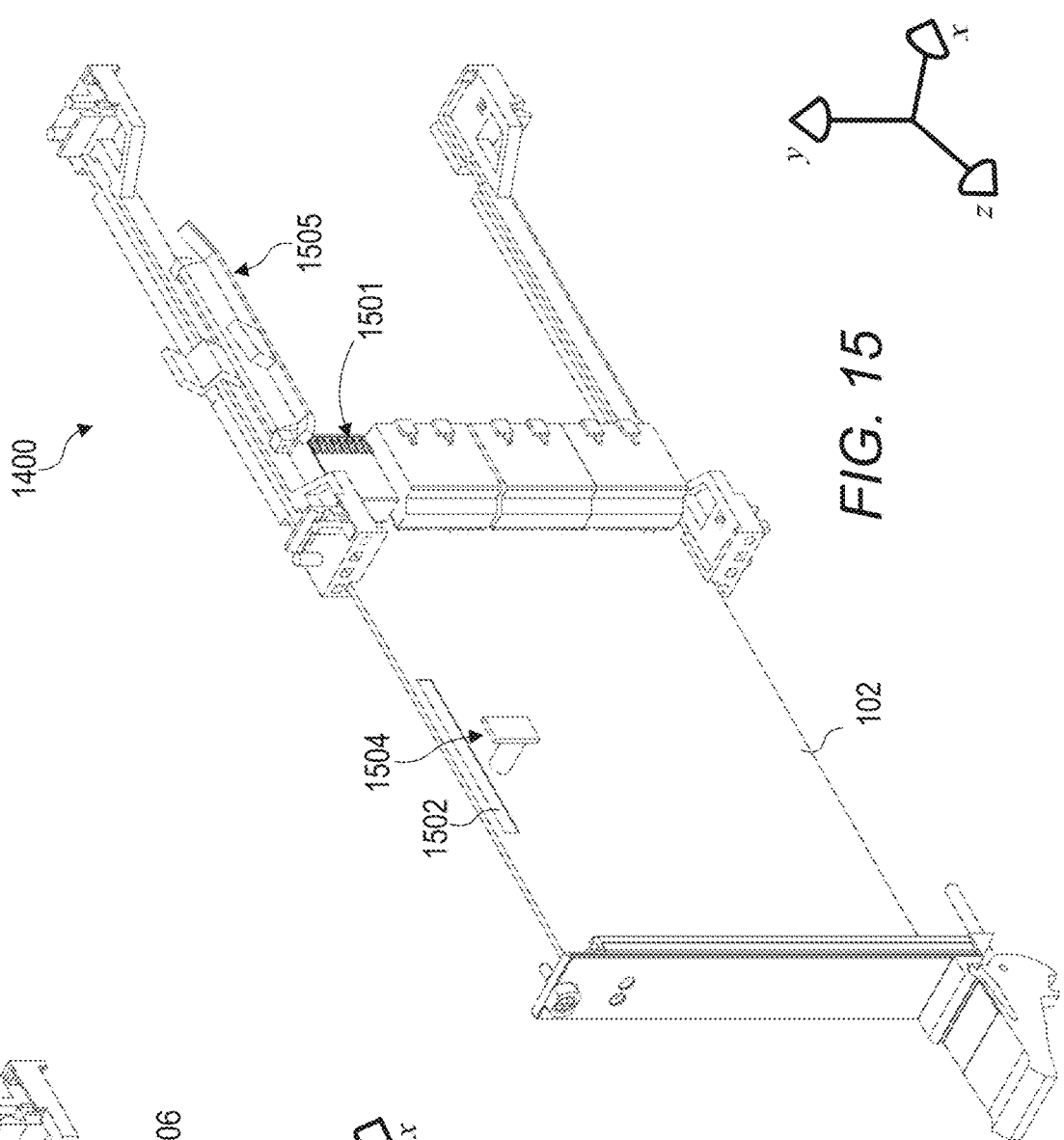
FIGS. 14-17 are diagrams illustrating an exemplary modular card cage accessory including features to facilitate electrical connections of an associated module or modules, according to some embodiments.

FIG. 15 illustrates a module 102 partially inserted into a slot including modular card cage accessory 1400. The slot may include a standard card guide on the bottom and the modular card cage accessory 1400 on top. The structure 1406 may be pushed out of the way by a component of the module 102, e.g., by backplane connector 1501 on the module 102. The structure 1406 may be configured so that springs or some other force will pull structure 1406 back down (e.g., into a closed position) again once the component is sufficiently inserted (e.g., when backplane connector is inserted past the hinge). The module 104 may include mechanical connector 1504, which may be a feature on the module which will catch and/or lock the mechanical connector 1408, thus securing the structure 1406 and the associated electrical connections on connector 1404 in place. Module 102 may further include an electrical connection area 1502 for electrical connections with the modular card cage accessory 1400, e.g., via electrical connections of structure 1406 (e.g., on the back side, as shown at 1505). In the illustrated example, electrical connection area 1502 appears recessed, but it will be appreciated that this is not limiting. The module 102 may include any of various types of connectors and/or other accommodations to connect with modular card cage accessory 1400.

FIG. 16 illustrates module 102 fully plugged into modular card cage accessory 1400, according to some embodiments. As shown, mechanical connector 1408 and mechanical connector 1504 may be in contact and structure 1406 may be fully closed.

FIG. 17 illustrates how this system can connect multiple modules together, according to some embodiments. For example, as shown, 3 adjacent slots each include a modular card cage accessory 1400 and a module 102. Each module 102 is connected via the modular card cage accessories to the module to its right. It will be appreciated that any number of modules may be connected in this way.

Figure 18:
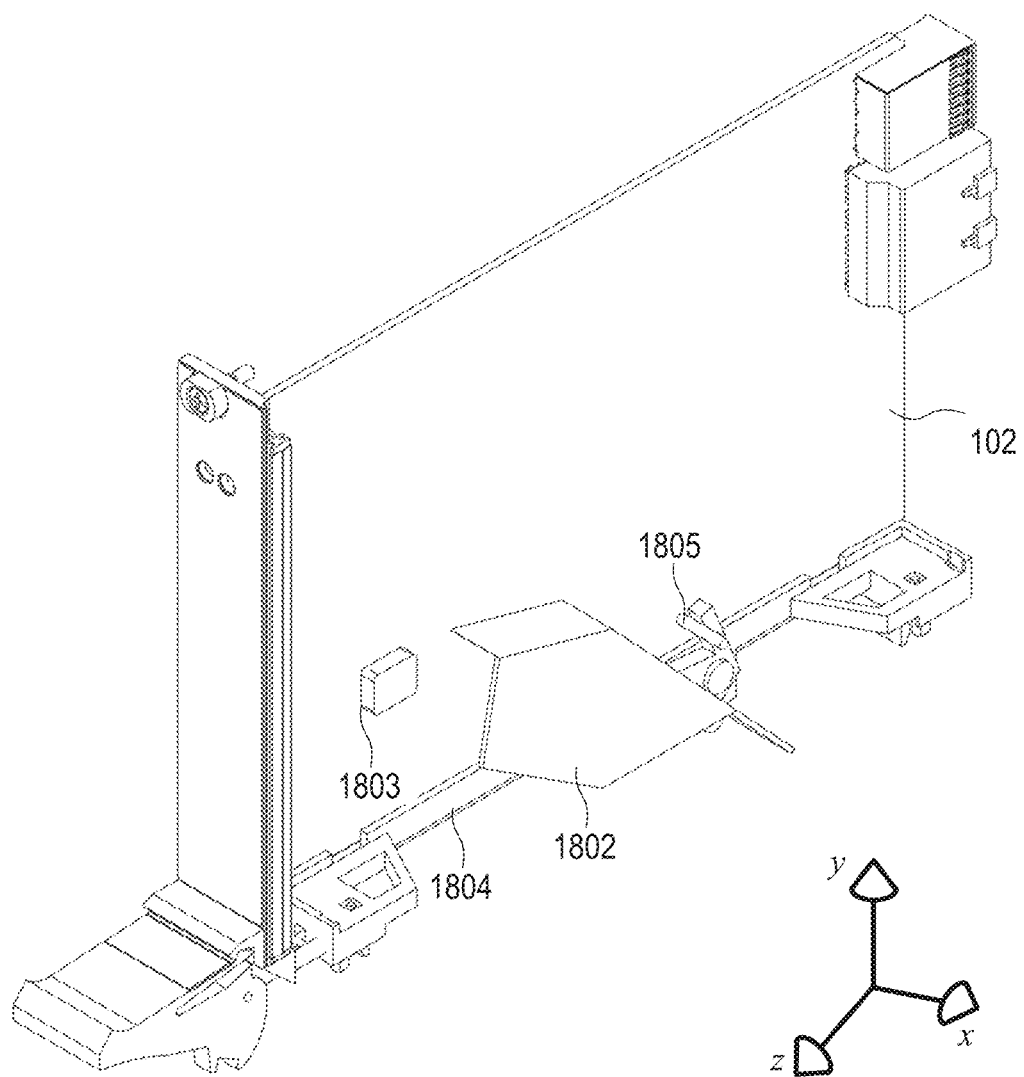

FIG. 18—Modular Card Cage Accessory Changing Shape

FIG. 18 illustrates a single module 102 plugged in to a slot, according to some embodiments. A modular card cage accessory may include a card guide 1804 that snaps into a card cage (e.g., card cage 107 of chassis 100) and a pivoting duct 1802, according to some embodiments. The pivoting duct 1802 may direct air coming from the bottom of the slot over the component 1803 of the module 102. For example, component 1803 may be a heat sink or a thermally sensitive component such as a processor. A pin 1805 may be configured to lift or rotate the duct into place as the module 102 is inserted into the slot (e.g., into card guide 1804).

Figure 19:
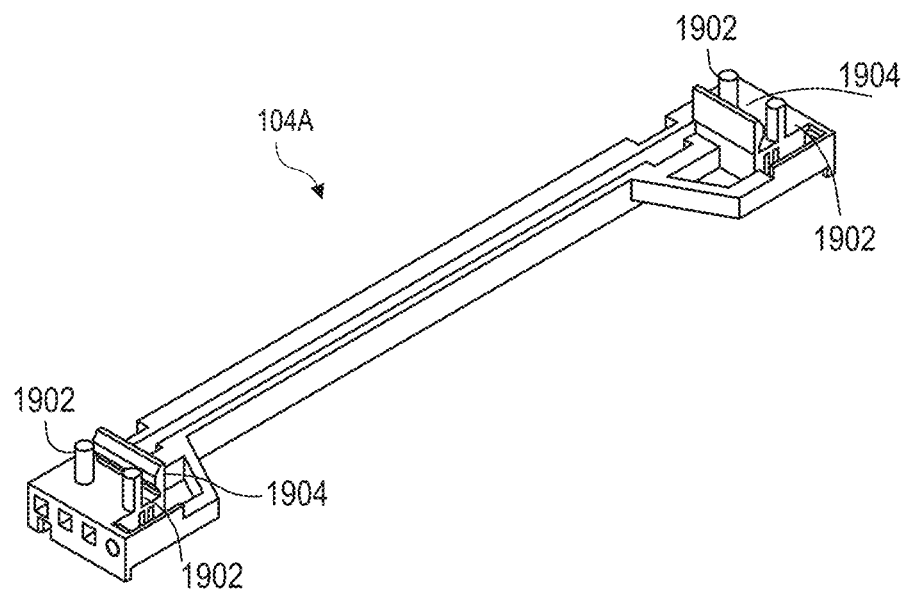
FIGS. 19-21 are diagrams illustrating an exemplary card guide side, according to some embodiments.
Figure 20:
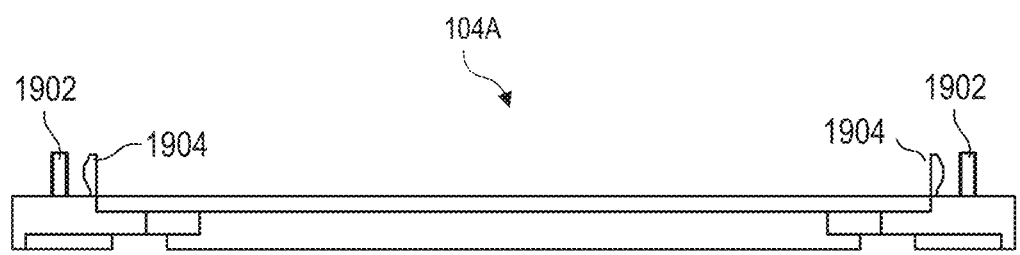
Figure 21:
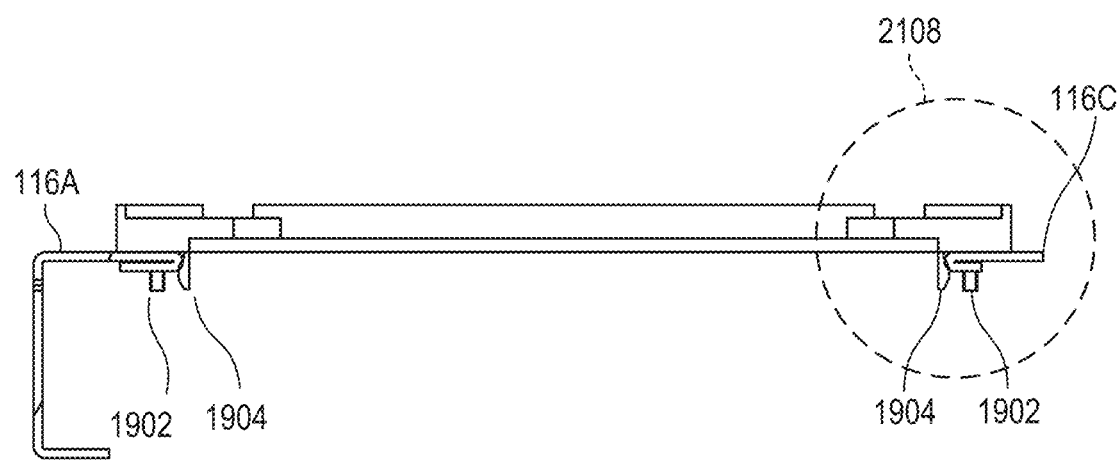

FIGS. 19-21—Modular Card Cage Accessory and/or Card Guide Mounting

A modular card cage accessory may attach to the chassis via a card guide (e.g., 104A-B) and/or be directly attached to one or more support member 116, among various possibilities. A module associated with the modular card cage accessory may be attached directly to the modular card cage accessory and/or to the chassis (e.g., in the same slot(s) and/or one or more other, potentially adjacent slot(s), via a card guide 104A-B and/or one or more support member 116).

In some embodiments, a modular card cage accessory may be configured to adjust a module insertion/installation location and/or add one or more additional module insertion/installation location(s). For example, a modular card cage accessory may move or adjust a location and/or dimension of one or more card guide(s). For example, a modular card cage accessory may move a card guide away from its standard position and/or adjust dimensions or angles of a card guide, e.g., to allow nonstandard cards to slide into the chassis with the aid of a card guide.

A modular card cage accessory may or may not include integrated card guide features. For example, a modular card cage accessory with an integrated card guide (e.g., for a peripheral) may serve as a replacement for an existing card guide of the chassis as well as including other features (e.g., air flow modifiers). In other words, a modular card cage accessory may be installed in a chassis 100 (e.g., in or along an existing card guide 104A-B or without use of a card guide 104A-B) and may include a card guide (e.g., for installation of an associated module). Thus, both a modular card cage accessory and an associated module may be attached to the chassis in a single slot, e.g., potentially using a single card guide 104A-B or a single card guide side (e.g., 104A alone or 104B alone). A modular card cage accessory with an integrated card guide may provide electrical connection(s) for the associated module for power and/or to other modules in the card cage, e.g., via a connection to the backplane or a bus of the chassis.

Further, a modular card cage accessory with an integrated card guide may be configured to allow installation of a nonstandard module (e.g., an electronic device with dimensions that may not conform to a standard module size or geometry, or a module with a nonstandard attachment feature, etc.). In other words, the modular card cage accessory may serve as an adapter to accept modules that would not otherwise conform to the card cage (e.g., and/or card guides, slots, etc. of the chassis/card cage).

In some embodiments, a modular card cage accessory may be installed using a card guide 104A-B, e.g., as described above regarding attaching a module 102. For example, the modular card cage accessory may include one or more mounting features for sliding into grooves of one or both sides of a card 104A-B where the modular card cage accessory may be held in place by friction.

A modular card cage accessory may be installed without using a card guide 104A-B, according to some embodiments. For example, a modular card cage accessory may be installed instead of (e.g., in the place of) a card guide or next to an existing card guide (e.g., and/or between existing card guides). For example, a modular card cage accessory may be attached directly to one or more support member(s) 116 and/or backplane 110, among various possibilities. In some embodiments, an existing card guide may be removed to allow installation of a modular card cage accessory (e.g., with or without an integrated card guide). More than one card guide may be replaced with a multi-slot modular card cage accessory. For example, a modular card cage accessory may be designed for and installed in two or more adjacent slots. The modular card cage accessory may provide a card guide (or guides) for one (or more) peripherals associated with the modular card cage accessory. Thus, a modular card cage accessory may span any number of slots and may provide means for mounting any number of modules (e.g., including a controller and/or one or more peripherals). A modular card cage accessory may or may not modify the card guides of a slot or slots. For example, a modular card cage accessory may modify the location of a card guide. Thus, a modular card cage accessory may be used to increase flexibility of module design (e.g., by changing width, depth, and/or other characteristics, of a slot(s) or card guide(s)). For example, the modular card cage accessory may change the printed circuit board (PCB) slot/groove width for the PCB thickness, e.g., changing the thickness(es) that may fit the slot.

As a further example of card guide features, a modular card cage accessory may include a blocker (or blockers) for preventing a module from being installed improperly in an integrated card guide of the modular card cage accessory. For example, a blocker may be a plastic slug for aligning a module with a card guide. A modular card cage accessory may include a location or locations for mounting a blocker (s). For example, such a blocker may be used to prevent installation of a card that may be different than a type of card for which the modular card cage accessory is designed.

FIGS. 19 and 20 illustrate an exemplary card guide side 104A, according to some embodiments. FIG. 21 illustrates the exemplary card guide side 104A attached to rails 116. It will be appreciated that card guide sides 104A and 104B may be symmetric, so although the illustrations are described in terms of 104A, 104B may be similar, according to some embodiments. In some embodiments, the card guide sides may not be symmetric. Further, it will be appreciated that the mounting features illustrated in these figures and/or discussed herein may apply to a modular card cage accessory.

As illustrated in FIG. 19, a card guide side 104 may include mounting features 1902 and/or 1904. In the illustrated example, mounting features 1902 are shown as pegs which may be inserted into holes (e.g., corresponding mounting features 702) of a rail 116, e.g., or other portion of a chassis 110. In the illustrated example, mounting features 1904 are shown as clips which may be clipped onto a rail 116, e.g., or other portion of a chassis 110. The portion(s) of the rail(s) 116 onto which the mounting features 1904 clip may be considered mounting features corresponding to mounting features 1904. It will be appreciated that other types of mounting features may be used instead of or in addition to the pegs and clips. For example, screws, bolts, magnets, adhesives, brackets, compression fittings, holes, slots, tabs, connectors, pins, etc., may be used. In some embodiments, pins that may be spring loaded to expand in diameter may be used.

FIG. 20 illustrates the card guide side 104 of FIG. 19 from a side view.

FIG. 21 illustrates the card guide side 104 of FIGS. 19 and 20 installed on rails 116A and 116C.

The mounting features 1902 and/or 1904 may be sufficient to capture and hold a card guide side (and any module/component or modular card cage accessory installed in the card guide) or a modular card cage accessory (e.g., installed in place of one or more card guide sides 104) in the card cage 107. It will be appreciated that such mounting features may take any of various forms. For example, pins (e.g., potentially configured to expand in diameter) may be sufficient (e.g., without clips). Similarly, clips alone (e.g., with no pins) may be sufficient. In some embodiments, plastic blanks (e.g., and/or similar guides) may be included to assist in module alignment before insertion of a module in a slot. Further, any or all of the mounting features 1902 and/or 1904 (or other mounting features) may be included in a modular card cage accessory. For example, in the case of a modular card cage accessory that is installed in place of (e.g., instead of) one or more card guide sides, such mounting features may be used to attach the modular card cage accessory to the chassis (e.g., using mounting features 702, rails 116, etc.).

In some embodiments, one side of a card guide (e.g., mounting features 1902 and/or 1904) attached to a single rail 106 may be sufficient to capture and hold the card guide (and any associated module or modular card cage accessory) in place. Similarly, in some embodiments, a modular card cage accessory may be secured in the card cage using a single rail (e.g., using mounting features 1902 and/or 1904 in conjunction with any corresponding mounting features 702 of the rail) instead of using multiple rails (e.g., as illustrated in FIG. 21). In other words, the modular card cage accessory may be secured using a single point of attachment.

In some embodiments, a modular card cage accessory may be mounted using a single card guide side (e.g., 104A or 104B). The modular card cage accessory may potentially include mounting features 1902 and/or 1904, e.g., in addition to mounting using the card guide side.

In some embodiments, a modular card cage accessory may be mounted using multiple card guide sides associated with multiple slots. For example, the modular card cage accessory may use bottom card guide sides (e.g., 104B) of a plurality of adjacent slots, e.g., without using corresponding top card guide sides (e.g., 104A). The modular card cage accessory may potentially include mounting features 1902 and/or 1904, e.g., in addition to mounting using the card guide sides.

In some embodiments, additional mounting features (e.g., similar to 1902 and/or 1904) may be used to attach a modular card cage accessory in a card cage. For example, such additional mounting features may attach the accessory directly to one or more additional mounting point on the chassis. The additional mounting point(s) may be on the backplane or other portion of the chassis (e.g., in the card cage or plenum, etc.). Further, such an additional mounting point may be on an adjacent module, e.g., a modular card cage accessory may be mounted in the card cage (e.g., partly or entirely) using an attachment point on a module. Such additional mounting features may be used instead of or in addition to the modular card cage accessory attaching using one or more card guide sides 104 and/or mounting features 1902 and/or 1904. For example, a modular card cage accessory may attach using card guide sides 104A and B of a single slot and additionally using one or more additional mounting features attaching to one or more additional mounting points. As another example, a modular card cage accessory may attach directly to a chassis using mounting features 1902 and/or 1904 in addition to using one or more additional mounting features attaching to one or more additional mounting points.

In some embodiments, a modular card cage accessory, when used in concert with a module in the same slot or a neighboring slot, may use something other than (or in addition to) friction along an insertion path to be secured to the chassis. It will be appreciated that some modules installed in card guides 104 may be held in place substantially by friction alone, according to some embodiments.

In some embodiments, a modular card cage accessory may replace one or more existing card guide.

In some embodiments, a modular card cage accessory may be mounted in a portion of a card cage where no card guides are (e.g., ordinarily) found. For example, a modular card cage accessory may be mounted on rails 116, but outside of the range on the rails (e.g., in the x direction, as shown in FIG. 1A) where card guides are installed. Similarly, a modular card cage accessory may be installed in between card guides, e.g., without using or replacing the card guides. As another example, a modular card cage accessory may be mounted on a rail 116 outside of an area normally associated with a chassis slot.

Modules Associated with Modular Card Cage Accessories

In some embodiments, a module 102 may include features for interacting with one or more modular card cage accessories. For example, a module 102 may include features to connect (e.g., thermally, electrically, and/or mechanically) to a modular card cage accessory or accessories. For example, a module may include electrical connections similar to 1502 and/or mechanical connections similar to 1504 and 1805, among various possibilities. Further, a module may include features which may change shape or otherwise interact with a modular card cage accessory. Further, a module may provide signaling (e.g., electrically) to cause a modular card cage accessory to take one or more actions (e.g., change shape or configuration, provide more or less cooling, etc.). Further, a module may have features that are ineffective when not combined with a modular card cage accessory (e.g. heat sink fins that are not in line with unmodified chassis airflow, but with application of a modular accessory they are in line with the new airflow). In other words, heat sink fins may be oriented, sized, or spaced based on an airflow modified by an associated modular card cage accessory. Similarly, a module may be designed with accessories that rely on (e.g., to function as designed, etc.) the presence of an associated modular card cage accessory. For example, a FAM may exceed a designed operating temperature without cooling from the associated modular card cage accessory. Further, a module may change its electrical behavior based on the presence or absence of an associated modular card cage accessory. For example, a module may respond to absence of an associated modular card cage accessory by dissipating less heat, and therefore limiting its performance. Similarly, a module may respond to presence of an associated modular card cage accessory by dissipating more heat, and therefore operating at a higher level of performance, performing additional functions, etc. As another example, a module may be designed in a nonstandard way such that it is incapable of mounting in a chassis without a card guide mounted in a unique position as part of a modular accessory.

Additional Information and Embodiments

It will be appreciated that, in the illustrated examples, chassis 100 uses pusher fans (e.g., 114) to generate air flow. However, embodiments of the invention may also be applied to systems with other methods for generating air flow. For example, pull fans may be used in addition to or instead of pusher fans, among various possibilities.

Similarly, other chassis architecture may be used. For example, bottom fan cooling architecture may be used in conjunction with one or more modular card cage accessories. Further, modular card cage accessories may be used in a chassis that includes fixed or adjustable turning vanes or deflectors or in a chassis that does not include such vanes/deflectors.

In some embodiments, a modular card cage accessory may be configured to operate in association with multiple modules. For example, a modular card cage accessory may provide cooling to multiple modules (e.g., simultaneously or at different times).

In a first set of embodiments, a chassis configured for receiving one or more electronic devices, may comprise: one or more fans, wherein the one or more fans are configured to provide a flow of air through the chassis; at least one mounting feature; and at least one modular diverter mounted to the at least one mounting feature, wherein the modular diverter is configured to adjust air flow around a particular electronic device of the one or more electronic devices in a manner corresponding to a design characteristic of the particular electronic device, wherein the manner corresponding to the design of the particular electronic device includes modifying air flow to at least one portion of the particular electronic device.

In some embodiments, the at least one portion of the particular electronic device includes a heat sink.

In some embodiments, the manner includes increasing air flow through the heat sink.

In some embodiments, the manner includes aligning air flow with fins of the heat sink.

In some embodiments, the chassis further comprises multiple slots, wherein the particular electronic device and the modular diverter are mounted in a same slot.

In some embodiments, the same slot is a controller slot, wherein the particular electronic device is a controller.

In some embodiments, the chassis further comprises multiple slots, wherein the particular electronic device is mounted in a particular slot, wherein said modifying air flow includes directing a portion of air flow from a slot adjacent to the particular slot toward the particular electronic device.

In a second set of embodiments, a modular diverter for installation in a chassis may comprise: a mounting feature for installation in a first slot of a chassis; at least one air flow modifier, wherein the at least one air flow modifier is configured to, when installed in the first slot of the chassis and a flow of air is present in the chassis, modify the air flow in the chassis based on a design characteristic of an associated module installed in the first slot or a second slot of the chassis adjacent to the first slot.

In some embodiments, to modify the air flow includes directing air flow toward a portion of the associated module.

In some embodiments, to modify the air flow includes reducing heat sink bypass.

In some embodiments, the modular diverter may further comprise at least one of: a mounting fixture for supporting a cooling loop; or a cooling loop.

In some embodiments, the modular diverter may further comprise an integrated card guide for the associated module, wherein the associated module is installed in the first slot via the integrated card guide.

In some embodiments, the modular diverter may further comprise a blocker.

In some embodiments, to modify the air flow includes ducting.

In some embodiments, when installed in the chassis, the modular diverter spans a single slot of the chassis, wherein the single slot is the first slot.

In some embodiments, when installed in the chassis, the modular diverter spans a plurality of slots of the chassis, wherein the plurality of slots includes the first slot.

In a third set of embodiments, a method may comprise: within a chassis, providing, by one or more fans, a flow of air to one or more electronic devices in one or more corresponding slots of the chassis; directing a portion of the flow of air using a modular diverter installed in a first slot of the chassis based on a cooling requirement of a particular one of the one or more electronic devices, wherein said directing is further based on at least one other characteristic of the particular electronic device.

In some embodiments, the at least one other characteristic includes a hard-to-reach heat sink.

In some embodiments, said directing includes deflecting air flow from a first direction to a second direction.

In some embodiments, the particular electronic device is a peripheral.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, steps in processes and procedures may admit permutation of order, and certain features of the invention may be utilized independently, all as would be apparent to one skilled in the art after having the benefit of this description of the invention. Changes may be made in the elements described herein without departing from the spirit and scope of the invention as defined in the following claims.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A modular card cage accessory, comprising:
  a mounting feature for installation in a first slot of a card cage of a chassis;
  an integrated card guide for installation of an associated electronic module in the first slot, wherein the modular card cage accessory provides a first electrical connection for the associated electronic module via a backplane of the chassis; and
  a component to provide a second electrical connection for the associated electronic module to a second electronic module in a second slot of the card cage of the chassis, wherein the second electrical connection is a direct connection and does not use the backplane of the chassis.

2. The modular card cage accessory of claim 1, wherein the modular card cage accessory further comprises electromagnetic shielding for the associated electronic module.

3. The modular card cage accessory of claim 1, wherein the modular card cage accessory has a first shape prior to installation of the associated electronic module and a second shape after the installation of the associated electronic module, wherein the second shape is different than the first shape.

4. The modular card cage accessory of claim 1, wherein the second electrical connection includes a data connection with a higher data rate than the first electrical connection.

5. The modular card cage accessory of claim 1, wherein the associated electronic module is a nonstandard module, wherein the integrated card guide allows for installation of the nonstandard module.

6. The modular card cage accessory of claim 1, wherein the modular card cage accessory further includes a sensor, wherein the second electrical connection includes a connection of the sensor to the second electronic module.

7. The modular card cage accessory of claim 1, wherein the modular card cage accessory is further configured to direct air flow to cool the associated electronic module.

8. The modular card cage accessory of claim 1, wherein the second electrical connection includes a data connection with a lower latency than the first electrical connection.

9. The modular card cage accessory of claim 1, wherein the second electrical connection supports signal requirements of the associated electronic module in excess of those supported by the first electrical connection.

10. A system, comprising:
a chassis comprising a card cage, the card cage comprising:
at least a first slot and a second slot; and
a backplane; and
a modular card cage accessory comprising:
a mounting feature for installation in the first slot of the card cage of the chassis;
an integrated card guide for installation of an associated electronic module in the first slot, wherein the modular card cage accessory provides a first electrical connection for the associated electronic module via the backplane of the chassis; and
a component to provide a second electrical connection for the associated electronic module to a second electronic module in the second slot of the card cage of the chassis, wherein the second electrical connection is a direct connection and does not use the backplane of the chassis.

11. The system of claim 10, wherein the modular card cage accessory further comprises electromagnetic shielding for the associated electronic module.

12. The system of claim 10, wherein the modular card cage accessory has a first shape prior to installation of the associated electronic module and a second shape after the installation of the associated electronic module, wherein the second shape is different than the first shape.

13. The system of claim 10, wherein the second electrical connection includes a data connection with a higher data rate than the first electrical connection.

14. The system of claim 10, wherein the associated electronic module is a nonstandard module, wherein the integrated card guide allows for installation of the nonstandard module.

15. The system of claim 10, wherein the modular card cage accessory further includes a sensor, wherein the second electrical connection includes a connection of the sensor to the second electronic module.

16. The system of claim 10, wherein the modular card cage accessory is further configured to direct air flow to cool the associated electronic module.

17. The system of claim 10, wherein the second electrical connection includes a data connection with a lower latency than the first electrical connection.

18. The system of claim 10, wherein the second electrical connection supports signal requirements of the associated electronic module in excess of those supported by the first electrical connection.

19. A method, comprising:
installing a modular card cage accessory in a first slot of a card cage of a chassis using a mounting feature of the modular card cage accessory, wherein the modular card cage accessory comprises:
an integrated card guide for installation of an associated electronic module in the first slot, wherein the modular card cage accessory provides a first electrical connection for the associated electronic module via a backplane of the chassis; and
a component to provide a second electrical connection for the associated electronic module to a second electronic module in a second slot of the card cage of the chassis, wherein the second electrical connection is a direct connection and does not use the backplane of the chassis.

20. The method of claim 19, wherein the modular card cage accessory is further configured to direct air flow to cool the associated electronic module.

* * * * *